US012638774B2

(12) United States Patent
Kato et al.

(10) Patent No.: US 12,638,774 B2
(45) Date of Patent: May 26, 2026

(54) EXPOSURE APPARATUS AND WIRING PATTERN FORMING METHOD

(71) Applicant: NIKON CORPORATION, Tokyo (JP)

(72) Inventors: Masaki Kato, Yokohama (JP); Yasushi Mizuno, Saitama (JP)

(73) Assignee: NIKON CORPORATION, Tokyo (JP)

( * ) Notice: Subject to any disclaimer, the term of this patent is extended or adjusted under 35 U.S.C. 154(b) by 93 days.

(21) Appl. No.: 18/543,635

(22) Filed: Dec. 18, 2023

(65) Prior Publication Data

US 2024/0118622 A1 Apr. 11, 2024

Related U.S. Application Data

(63) Continuation of application No. PCT/JP2022/027215, filed on Jul. 11, 2022.

(30) Foreign Application Priority Data

Jul. 12, 2021 (JP) .................................. 2021-115324

(51) Int. Cl.
*G03F 7/20* (2006.01)

(52) U.S. Cl.
CPC ..................................... *G03F 7/20* (2013.01)

(58) Field of Classification Search
CPC .... G03F 7/20; G03F 7/70291; G03F 7/70258; G03F 9/7046; G03F 9/7088; G02B 26/0833; H01L 24/03; H01L 2224/0362
See application file for complete search history.

(56) References Cited

U.S. PATENT DOCUMENTS

| | | | | |
|---|---|---|---|---|
| 7,198,969 B1 * | 4/2007 | Khandros | ............... | H01L 22/32 |
| | | | | 438/33 |
| 7,961,763 B2 * | 6/2011 | Furman | ............ | G01N 21/95623 |
| | | | | 372/30 |

(Continued)

FOREIGN PATENT DOCUMENTS

| | | |
|---|---|---|
| JP | 2007-027429 A | 2/2007 |
| JP | 2007-052214 A | 3/2007 |

(Continued)

OTHER PUBLICATIONS

Jan. 16, 2024 International Preliminary Report on Patentability issued in International Patent Application No. PCT/JP2022/027215.

(Continued)

*Primary Examiner* — Hung V Nguyen
(74) *Attorney, Agent, or Firm* — Oliff PLC

(57) ABSTRACT

An exposure apparatus includes a spatial light modulator, a calculation unit configured to calculate positions of first connection portions of a first semiconductor chip provided on a substrate and positions of second connection portions of a second semiconductor chip provided on the substrate, based on a first position measurement result, a second position measurement result, and design information of the first connection portions and the second connection portions, the first position measurement result being a measurement result of positions of measurement points on the first semiconductor chip, the second position measurement result being a measurement result of positions of measurement points on the second semiconductor chip, and an exposure processing unit configured to control the spatial light modulator based on a calculation result by the calculation unit so as to expose wiring patterns connecting the first connection portions and the second connection portions.

20 Claims, 20 Drawing Sheets

(56) References Cited

U.S. PATENT DOCUMENTS

| | | | | |
|---|---|---|---|---|
| 8,645,891 | B2 * | 2/2014 | Kitamura | G06F 30/398 |
| | | | | 716/126 |
| 8,656,333 | B1 * | 2/2014 | Bishop | H01L 24/06 |
| | | | | 257/784 |
| 2007/0020537 | A1 | 1/2007 | Harakawa et al. | |
| 2010/0208229 | A1 | 8/2010 | Shin et al. | |
| 2012/0081681 | A1 | 4/2012 | Nakazawa et al. | |
| 2014/0007033 | A1 | 1/2014 | Kitamura et al. | |
| 2018/0143542 | A1 | 5/2018 | Hirai et al. | |

FOREIGN PATENT DOCUMENTS

| | | | |
|---|---|---|---|
| JP | 2010-533310 | A | 10/2010 |
| JP | 2012-093701 | A | 5/2012 |
| JP | 2014-011264 | A | 1/2014 |
| JP | 2016-071022 | A | 5/2016 |
| JP | 2018-081281 | A | 5/2018 |
| KR | 10-2015-0034079 | A | 4/2015 |

OTHER PUBLICATIONS

Sep. 27, 2022 Search Report issued in International Patent Application No. PCT/JP2022/027215.
Jul. 21, 2025 Office Action issued in Korean Patent Application No. 10-2024-7000729.
Mar. 26, 2026 Office Action issued in Taiwanese Patent Application No. 111126048.

* cited by examiner

600

DATA
GENERATION
DEVICE

300

EXPOSURE
CONTROL
DEVICE

400

FIRST
STORAGE
DEVICE

310R

SECOND
STORAGE
DEVICE

310L

FB

201

202

204

203

205

200

Z

Y

X

WF

Z

Y

X

204a

204a

Z

Y

X

204a

204a

Z

Y

X

204a

204a

Z

Y

X

204a

204a

FIG. 10A
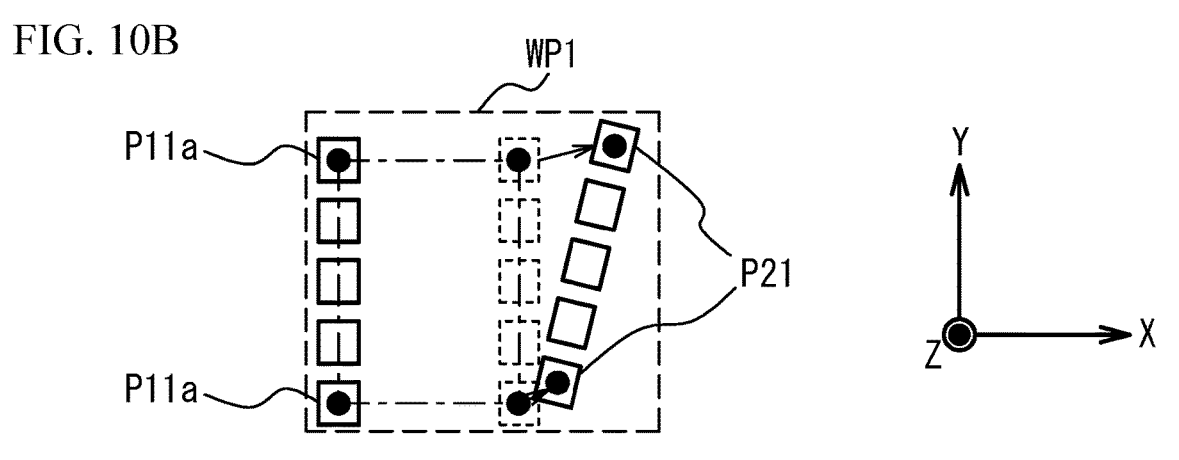
FIG. 10B
FIG. 10C
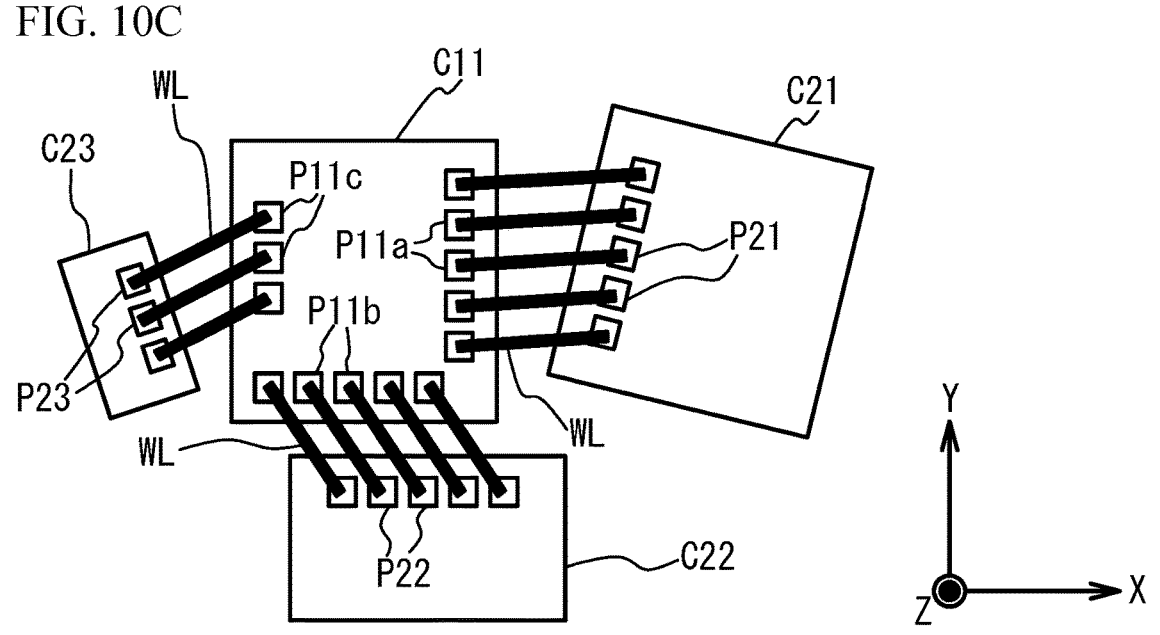

CORRECTION REGION   CORRECTION REGION

WL

C11

C21

P11a

NON-CORRECTION REGION

WL

C11

C21

P11a

NON-CORRECTION REGION

P21

WL

C11

C21

P11a

NON-CORRECTION REGION

P21

+X DIRECTION SHIFT

−Y DIRECTION SHIFT

+X DIRECTION SHIFT
−Y DIRECTION SHIFT
$\theta$z ROTATION

FIG. 12A
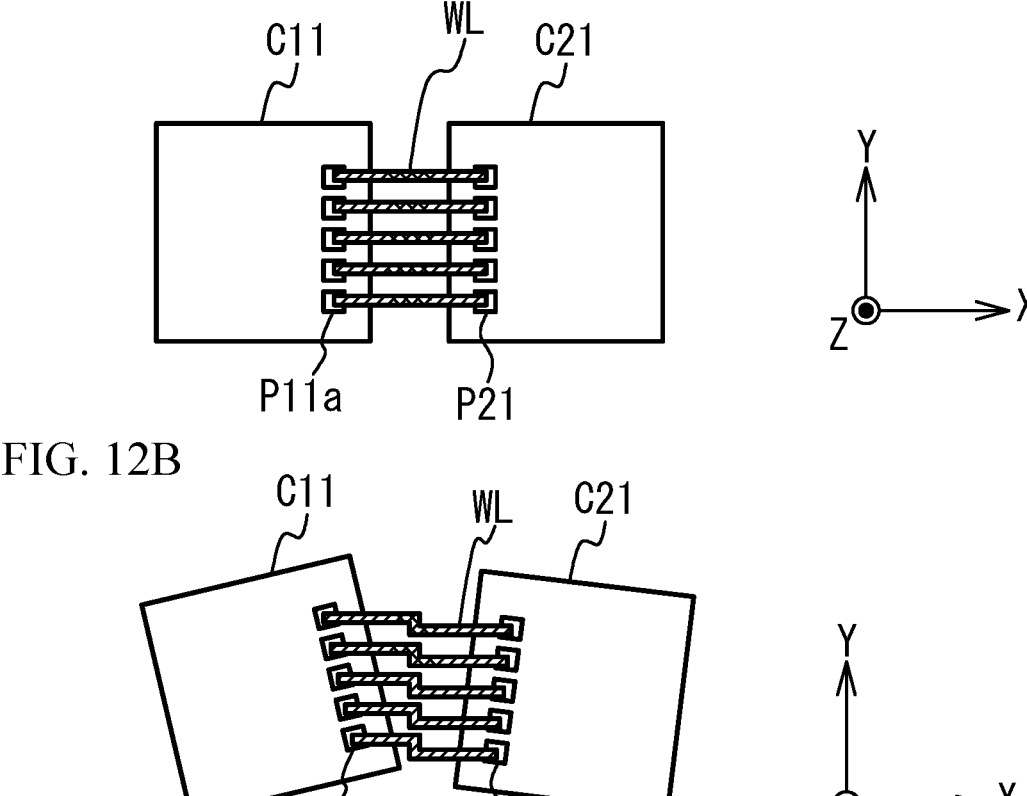
FIG. 12B
FIG. 12C
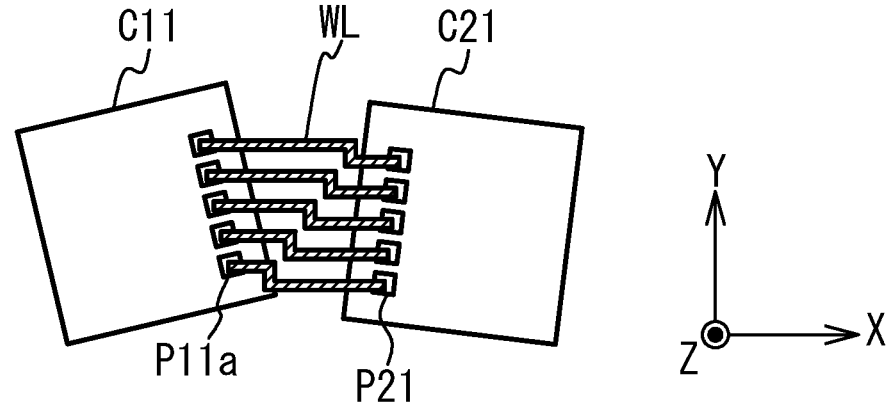

FIG. 16A
FIG. 16B
FIG. 16C
FIG. 16D
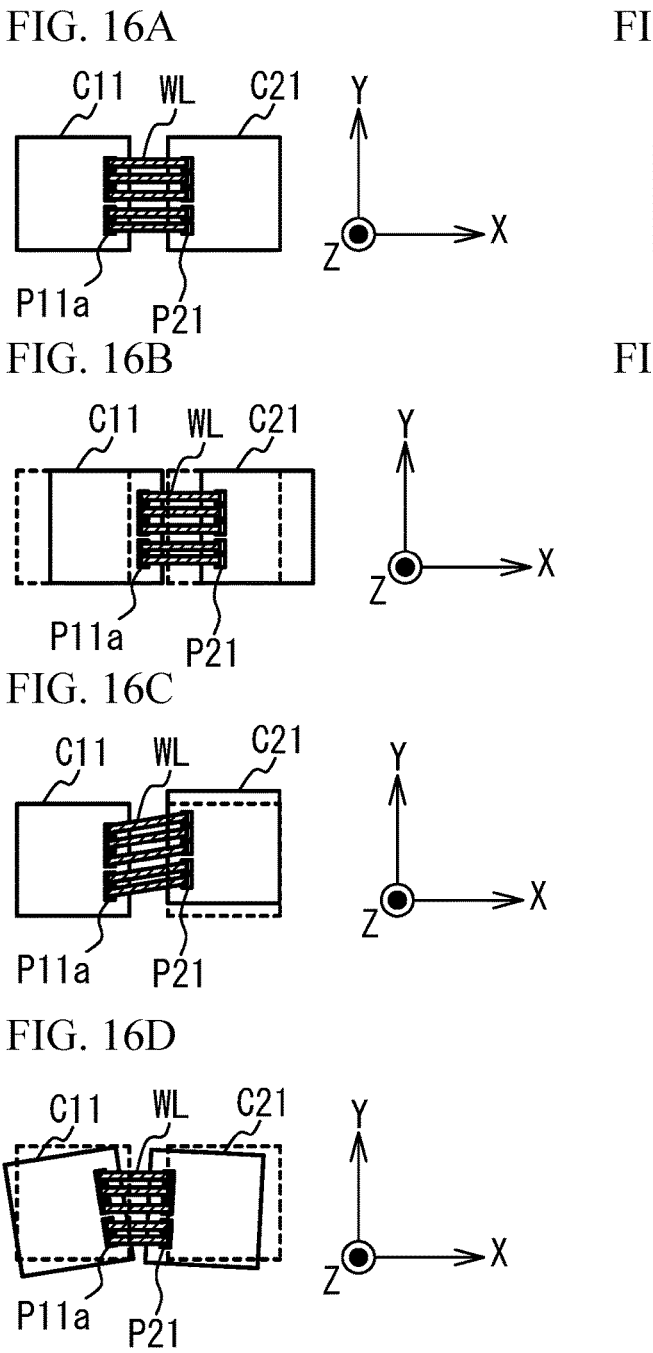
FIG. 16E
FIG. 16F
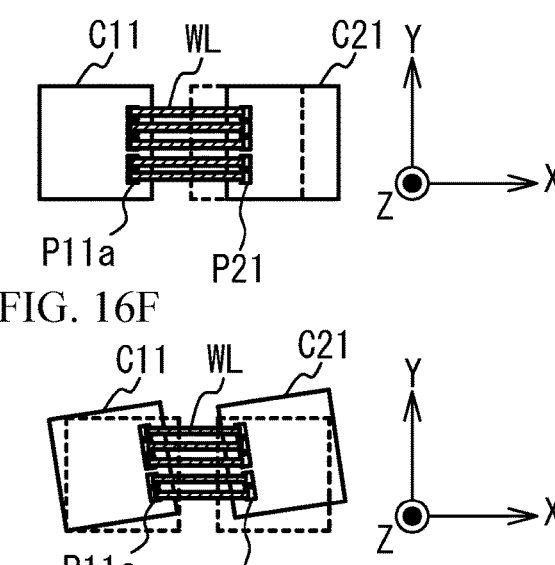

EXPOSURE APPARATUS AND WIRING PATTERN FORMING METHOD

CROSS-REFERENCE TO RELATED APPLICATION

This application is based upon and claims the benefit of priority of the prior International Patent Application No. PCT/JP2022/027215, filed on Jul. 11, 2022, the entire contents of which are incorporated herein by reference.

FIELD

The present disclosure relates to an exposure apparatus and a wiring pattern forming method.

BACKGROUND

In recent years, packages of semiconductor devices called FO-WLP (Fan Out Wafer Level Package) and FO-PLP (Fan Out Plate Level Package) have been known.

For example, in the manufacture of the FO-WLP, a plurality of semiconductor chips are arranged on a wafer-shaped support substrate and are fixed with a mold material such as a resin to form a pseudo wafer, and a rewiring layer for connecting pads of the semiconductor chips to each other is formed using an exposure apparatus (Japanese Patent Application Laid-Open No. 2018-081281 (Patent Document 1)).

SUMMARY

It is desired to improve the throughput in the formation of the rewiring layer of the FO-WLP and the FO-PLP.

In one aspect of the present disclosure, there is provided an exposure apparatus including: a spatial light modulator; a calculation unit configured to calculate positions of first connection portions of a first semiconductor chip provided on a substrate and positions of second connection portions of a second semiconductor chip provided on the substrate, based on a first position measurement result, a second position measurement result, and design information of the first connection portions and the second connection portions, the first position measurement result being a measurement result of positions of measurement points on the first semiconductor chip, the second position measurement result being a measurement result of positions of measurement points on the second semiconductor chip; and an exposure processing unit configured to control the spatial light modulator based on a calculation result by the calculation unit so as to expose wiring patterns connecting the first connection portions and the second connection portions.

The configuration of the embodiment described later may be appropriately modified, and at least a part of the configuration may be replaced with another configuration. Further, the constituent elements whose arrangement is not particularly limited are not limited to the arrangement disclosed in the embodiment, and can be arranged at positions where the functions can be achieved.

BRIEF DESCRIPTION OF DRAWINGS

FIG. 10A illustrates chips fixed to a wafer with being shifted from design positions, FIG. 10B is an enlarged view of a partial wiring portion, and FIG. 10C is a view illustrating a state where chips arranged with being shifted from the design positions are connected to each other by wiring patterns;

FIG. 12A illustrates a wiring pattern for connecting pads of chips arranged at the design positions, and FIG. 12B and FIG. 12C are diagrams for describing other examples of a wiring pattern for connecting pads of chips at positions shifted from the design positions;

FIG. 16A illustrates a wiring pattern for connecting pads of chips arranged at the design positions, and FIG. 16B to FIG. 16F are diagrams for describing other examples of a method of forming a wiring pattern for connecting pads of chips shifted from the design positions;

DESCRIPTION OF EMBODIMENTS

First Embodiment

An exposure apparatus in accordance with a first embodiment will be described with reference to FIG. 1 to FIG. 13. In the following description, a substrate P indicates a rectangular substrate, and a wafer-shaped substrate is referred to as a wafer WF. In the following description, the normal direction of the substrate P or wafer WF placed on a substrate stage 30 (to be described later) is defined as the Z-axis direction, the direction in which the substrate P or wafer WF is scanned relative to a spatial light modulator (SLM) in a plane orthogonal to the Z-axis direction is defined as the X-axis direction, the direction orthogonal to the Z-axis and X-axis is defined as the Y-axis direction, and the rotation (tilt) directions around the X-axis, Y-axis, and Z-axis are defined as the θx, θy, and θz directions, respectively. Examples of the spatial light modulator include a liquid crystal element, a digital micromirror device (DMD), and a magneto-optic spatial light modulator (MOSLM). The exposure apparatus EX according to the first embodiment includes a DMD 204 as the spatial light modulator, but may include other spatial light modulators.

Figure 1:
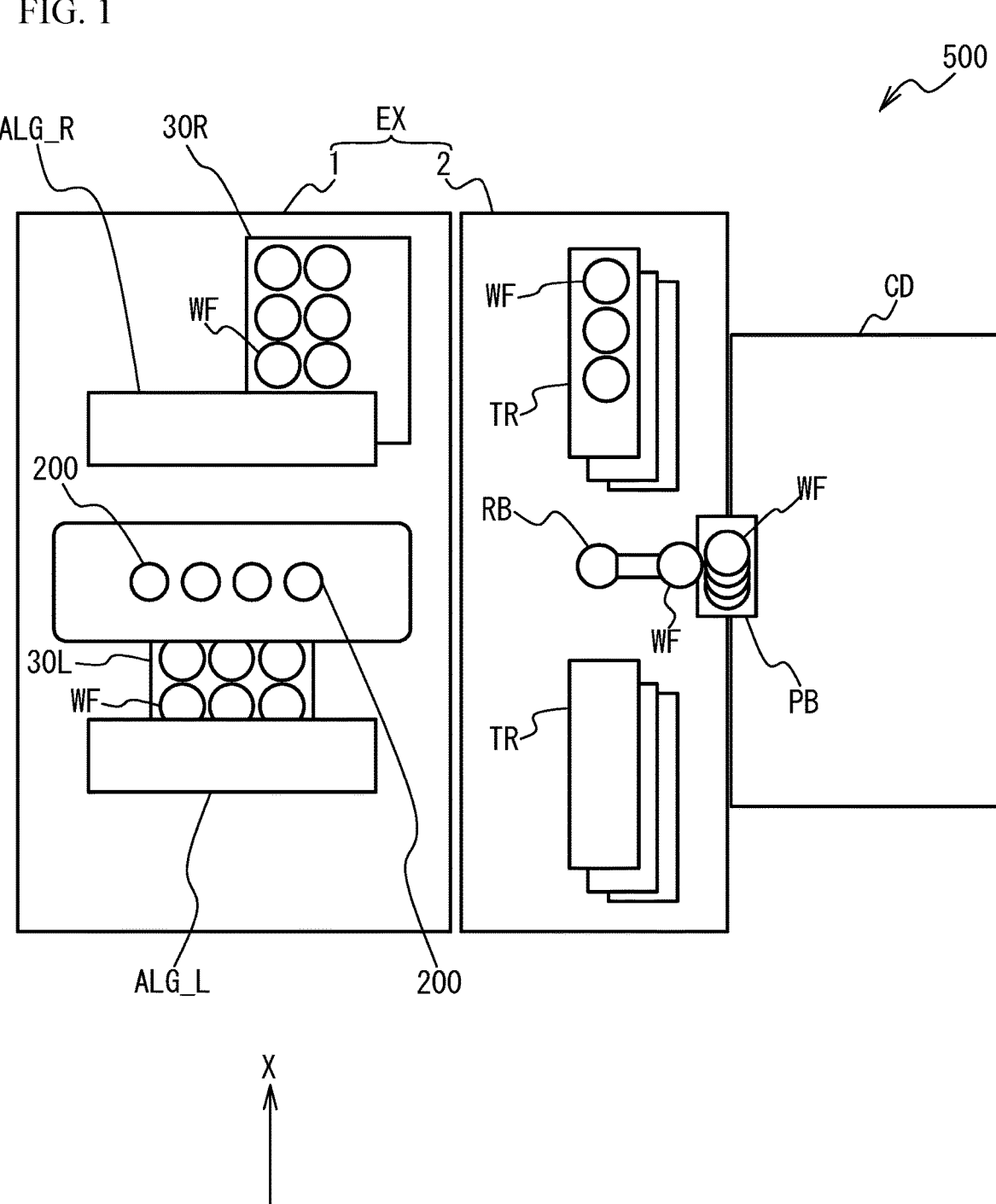
FIG. 1 is a top view illustrating an outline of a wiring pattern formation system of an FO-WLP including an exposure apparatus in accordance with a first embodiment.
Figure 2:
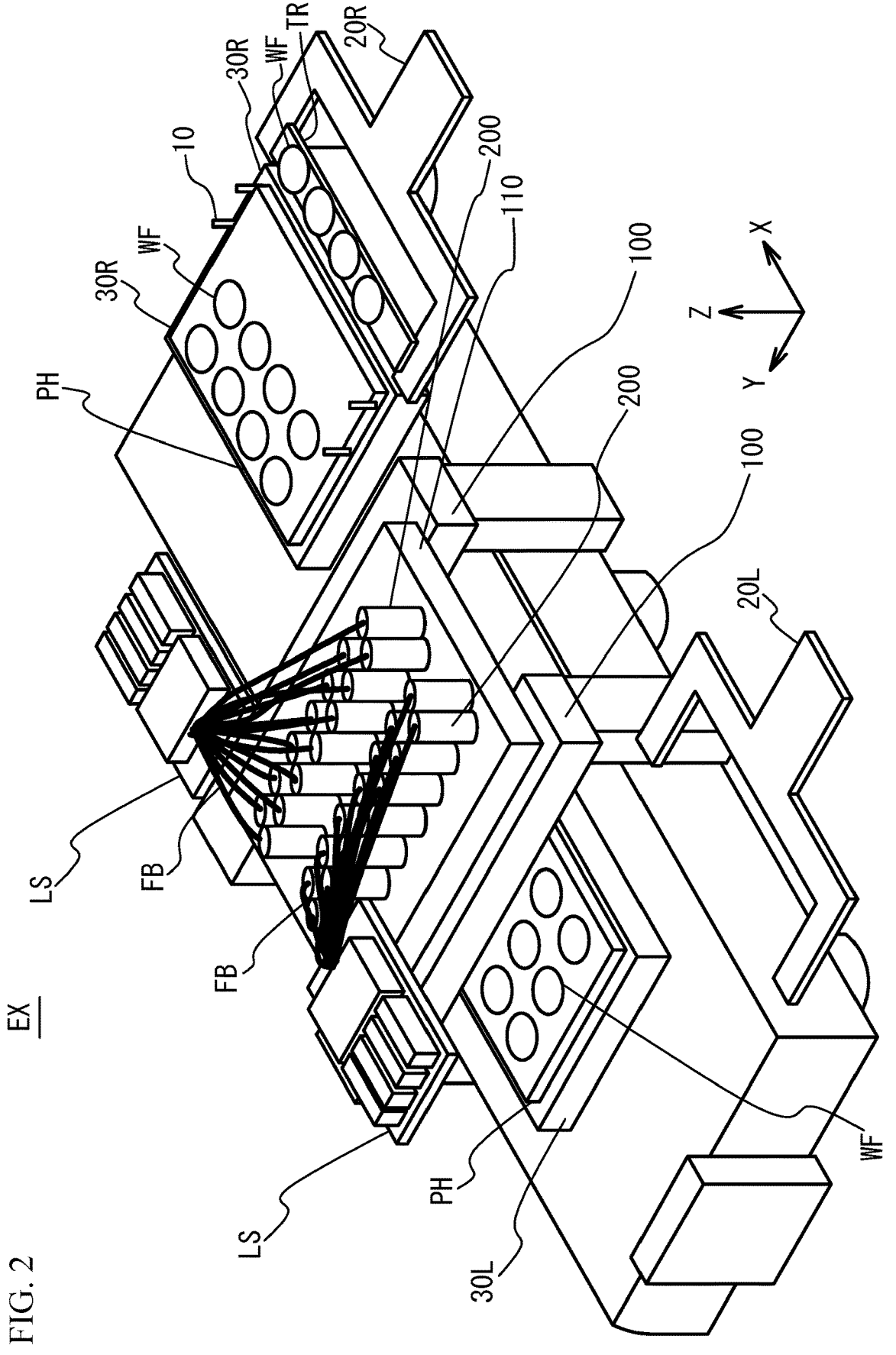
FIG. 2 is a perspective view schematically illustrating a configuration of the exposure apparatus in accordance with the first embodiment.
Figure 3A:
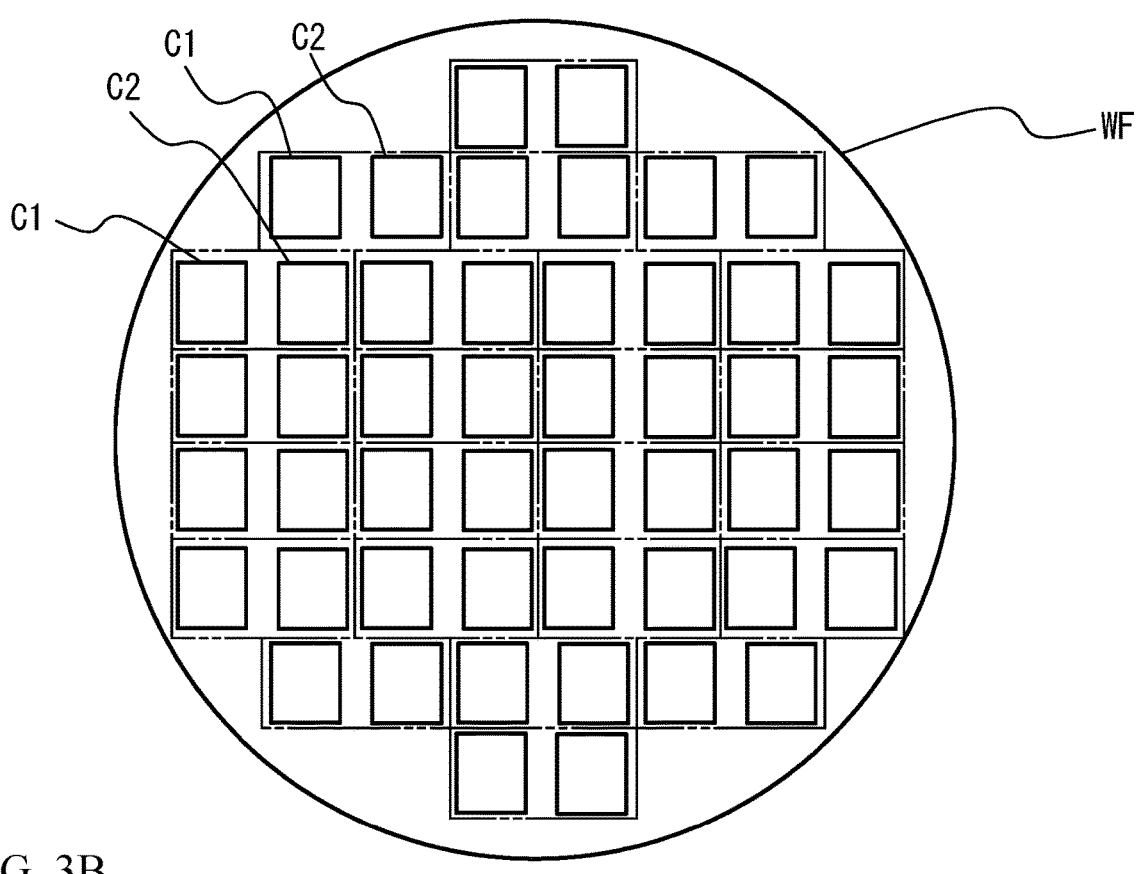
FIG. 3A and FIG. 3B are diagrams for describing wiring patterns formed by the wiring pattern formation system.
Figure 3B:
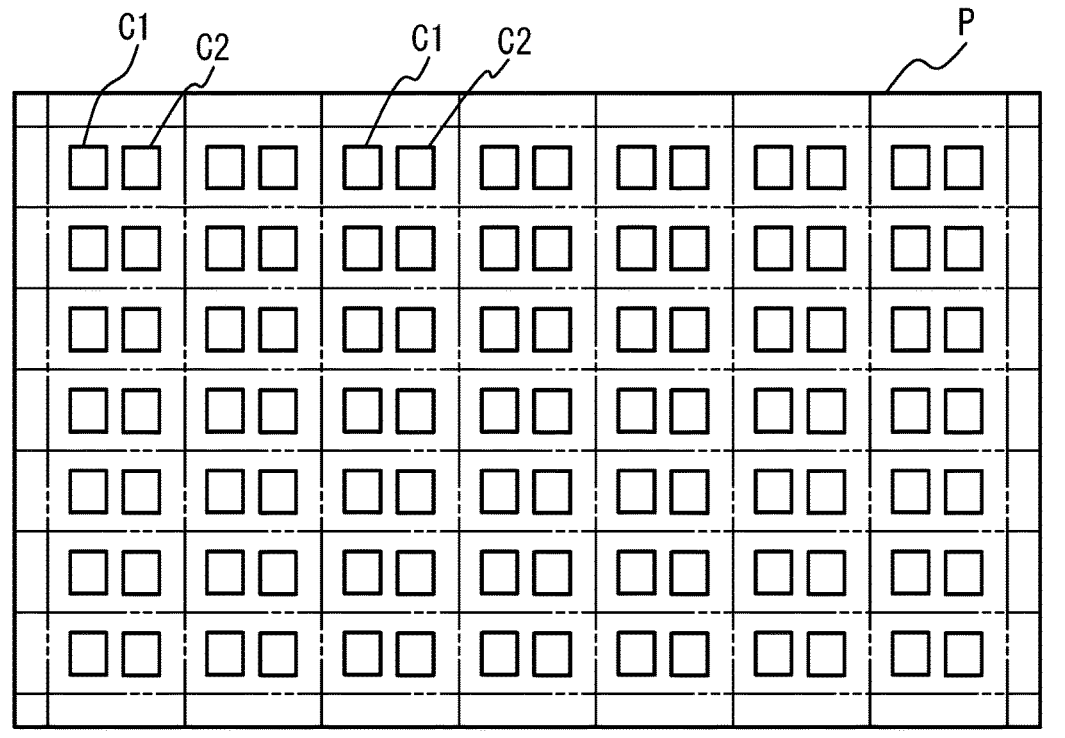

FIG. 1 is a top view illustrating an outline of a wiring pattern formation system 500 of the FO-WLP and the FO-PLP including an exposure apparatus EX in accordance with an embodiment. FIG. 2 is a perspective view schematically illustrating a configuration of the exposure apparatus EX. FIG. 3A and FIG. 3B are diagrams for describing a wiring pattern formed by the wiring pattern formation system.

The wiring pattern formation system 500 is a system for forming wiring patterns for connecting semiconductor chips (hereinafter, referred to as "chips") arranged on the wafer WF as illustrated in FIG. 3A or for connecting chips arranged on the substrate P as illustrated in FIG. 3B.

In the present embodiment, wiring patterns each connecting a chip C1 and a chip C2 included in each of sets (indicated by double-dotted lines) of chips arranged on the wafer WF or the substrate P are formed. Although FIG. 3A and FIG. 3B illustrate a case where the number of chips included in each set is two, the number of chips included in each set may be three or more.

The following describes a case where wiring patterns for connecting chips arranged on the wafer WF are formed.

As illustrated in FIG. 1, the wiring pattern formation system 500 includes a coater/developer device CD and the exposure apparatus EX.

The coater/developer device CD coats the wafer WF with a photosensitive resist. The wafer WF coated with the resist is carried into a buffer section PB capable of stocking a plurality of wafers WF. The buffer section PB also serves as a delivery port for the wafer WF.

More specifically, the buffer section PB includes a carry-in section and a carry-out section. The wafers WF coated with a resist are carried into the carry-in section one by one from the coater/developer device CD. The wafers WF coated with the resist are carried into the carry-in section one by one at predetermined time intervals from the coater/developer device CD, and a plurality of the wafers WF are mounted together on a tray TR described later, and therefore, the carry-in section functions as a buffer for storing the wafers WF.

The carry-out section functions as a buffer when the exposed wafer WF is carried out to the coater/developer device CD. The coater/developer device CD can take out the exposed wafers WF only one by one. Thus, the tray TR on which the exposed wafers WF are mounted is placed in the carry-out section. This allows the coater/developer device CD to take out the exposed wafers WF one by one from the tray TR.

The exposure apparatus EX includes a main unit 1 and a substrate exchange unit 2. As illustrated in FIG. 1, a robot RB is installed in the substrate exchange unit 2. The robot RB arranges the wafers WF placed in the buffer section PB on one tray TR.

As illustrated in FIG. 1 and FIG. 2, in the first embodiment, 4 rows×3 columns of the wafers WF can be placed on each of substrate stages 30R and 30L described later. The tray TR in accordance with the first embodiment is a lattice-shaped tray that allows 4 rows×1 column of the wafers WF to be sequentially placed on the substrate stages 30R and 30L. The tray TR may be a tray that allows wafers WF to be placed at a time on the entire surface of each of the substrate stages 30R and 30L (that is, a tray on which 4 rows×3 columns of the wafers WF can be arranged). Hereinafter, the substrate stages 30R and 30L are referred to as the substrate stages 30 when it is not necessary to distinguish between the substrate stages 30R and 30L.

As illustrated in FIG. 2, the substrate exchange unit 2 includes exchange arms 20R and 20L. The exchange arm 20R carries in and out the wafers WF (more specifically, the tray TR on which the wafers WF are placed) to and from the substrate holder PH of the substrate stage 30R, and the exchange arm 20L carries in and out the wafers WF to and from the substrate holder PH of the substrate stage 30L. In the following description, the exchange arms 20R and 20L are referred to as exchange arms when it is not necessary to distinguish between the exchange arms 20R and 20L in particular. In addition, the substrate holder PH is not illustrated in the drawings other than FIG. 2.

Generally, each of the exchange arms 20R and 20L includes a carry-in arm for carrying in the tray TR and a carry-out arm for carrying out the tray TR. This configuration allows the tray TR to be replaced at high speed. When the wafers WF are carried in, substrate exchange pins 10 support the lattice-shaped tray TR. When the substrate exchange pins 10 are lowered, the tray TR is sunk into a groove (not illustrated) formed in the substrate stage 30, and the wafer WF is sucked and held by the substrate holder PH on the substrate stage 30. When a row of substrates is placed on the tray TR as illustrated in FIG. 2, the position of the substrate stage 30R or 30L or the position of the exchange arm 20R or 20L is changed in accordance with the position of each tray TR on the substrate stage 30R or 30L.

Figure 4:
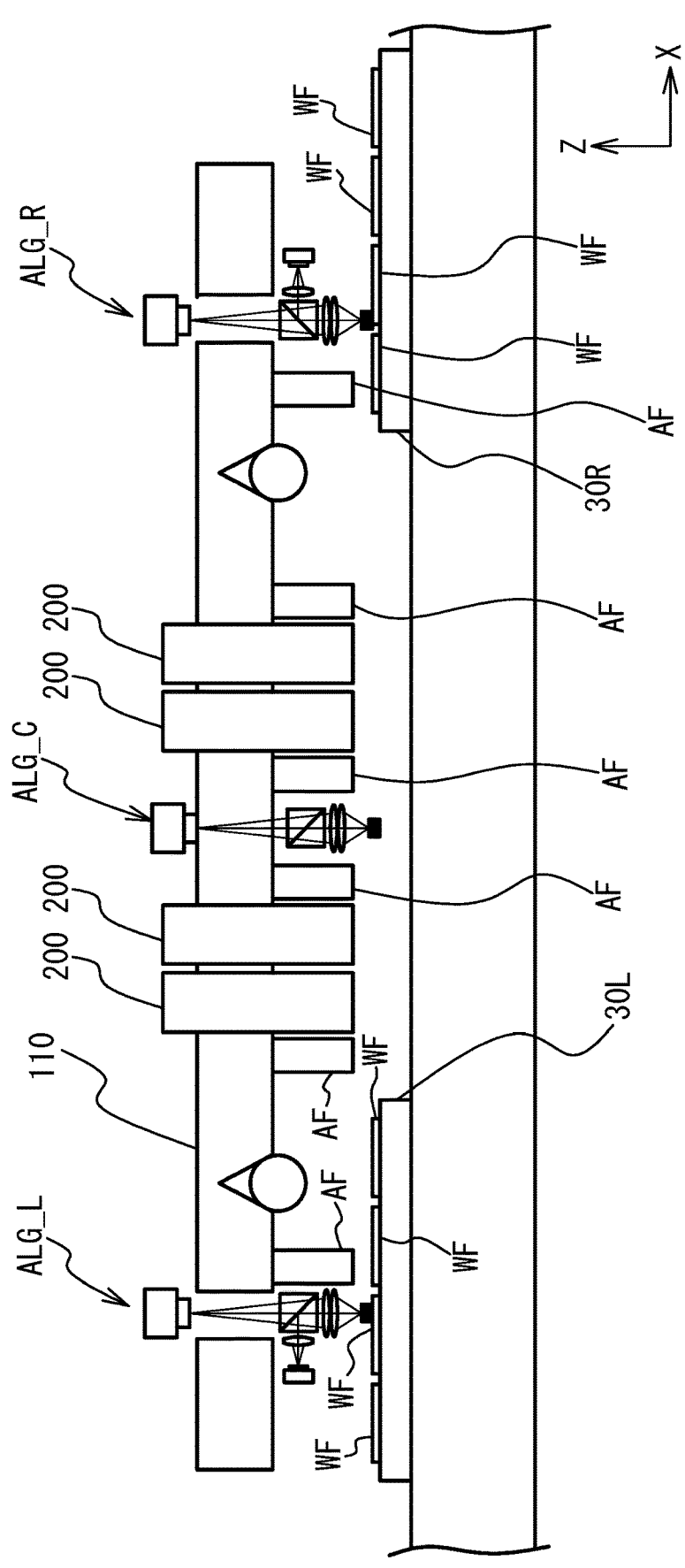
FIG. 4 is a view for describing modules arranged on an optical surface plate.

When the wafer WF is sucked by the substrate holder PH, the positions of predetermined measurement points on chips arranged on the wafer WF are measured by an alignment system ALG_R or ALG_L mounted on an optical surface plate 110. FIG. 4 is a view for describing modules arranged on the optical surface plate 110.

As illustrated in FIG. 4, the alignment systems ALG_R and ALG_L are mounted on the optical surface plate 110 kinematically supported on a column 100 (see FIG. 2). Further, as illustrated in FIG. 4, on the optical surface plate 110, in addition to the alignment systems ALG_R and ALG_L, a plurality of illumination/projection modules 200, autofocus systems AF, and an alignment system ALG_C are arranged.

Each of the alignment systems ALG_R and ALG_L includes a plurality of measurement microscopes, and measure the positions of predetermined measurement points on chips arranged on each wafer WF placed on the substrate holder of the substrate stage 30, with reference to a reference mark 60a (see FIG. 8) of an alignment device 60. The measurement results are output to a data generation device 300 included in a control system 600 of the exposure apparatus EX.

Figure 5:
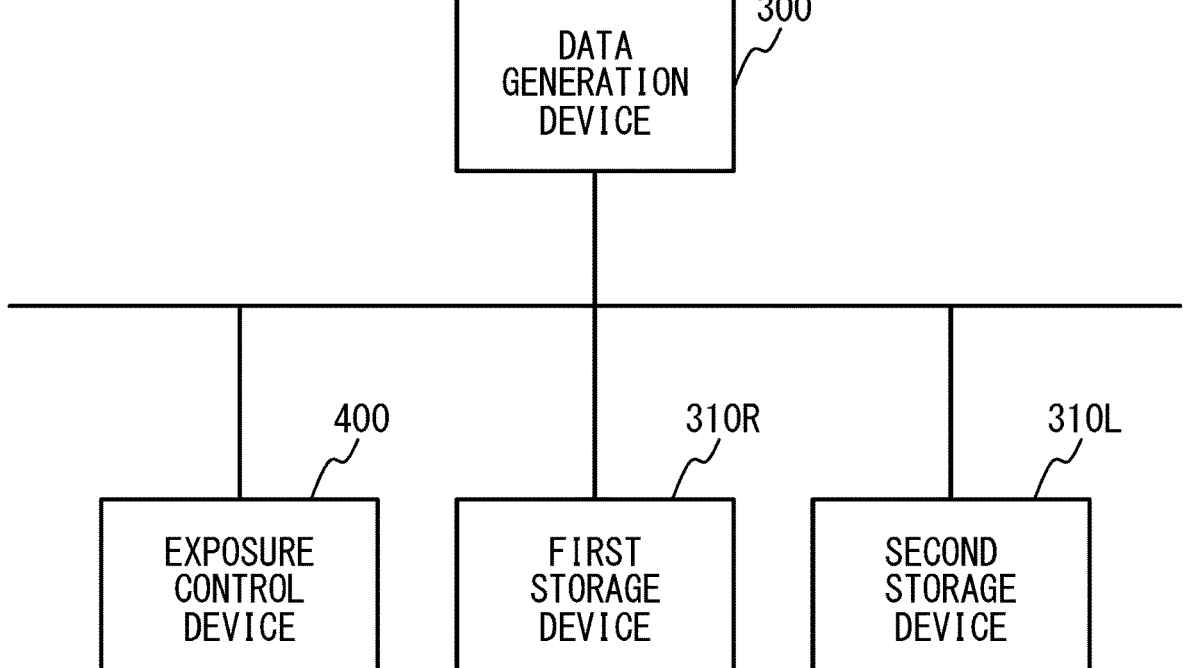
FIG. 5 is a block diagram illustrating a control system of the exposure apparatus in accordance with the first embodiment.

FIG. 5 is a block diagram illustrating the control system 600 of the exposure apparatus EX according to the present embodiment. As illustrated in FIG. 5, the control system 600 includes the data generation device 300, a first storage device 310R, a second storage device 310L, and an exposure control device 400.

The data generation device 300 calculates the positions of all pads of each chip based on the position measurement results of predetermined measurement points on the chips provided on the wafers WF placed on the substrate holder of the substrate stage 30, which are received from the alignment systems ALG_R and ALG_L. The data generation device 300 determines a wiring pattern for connecting pads based on the calculation results of the positions of the pads of each chip, and generates control data used to control the DMD 204 (details will be described later) when generating the determined wiring pattern.

The reason why the data generation device 300 determines the wiring pattern for connecting the pads based on the calculation results of the positions of the pads of each chip will be described.

Figure 6A:
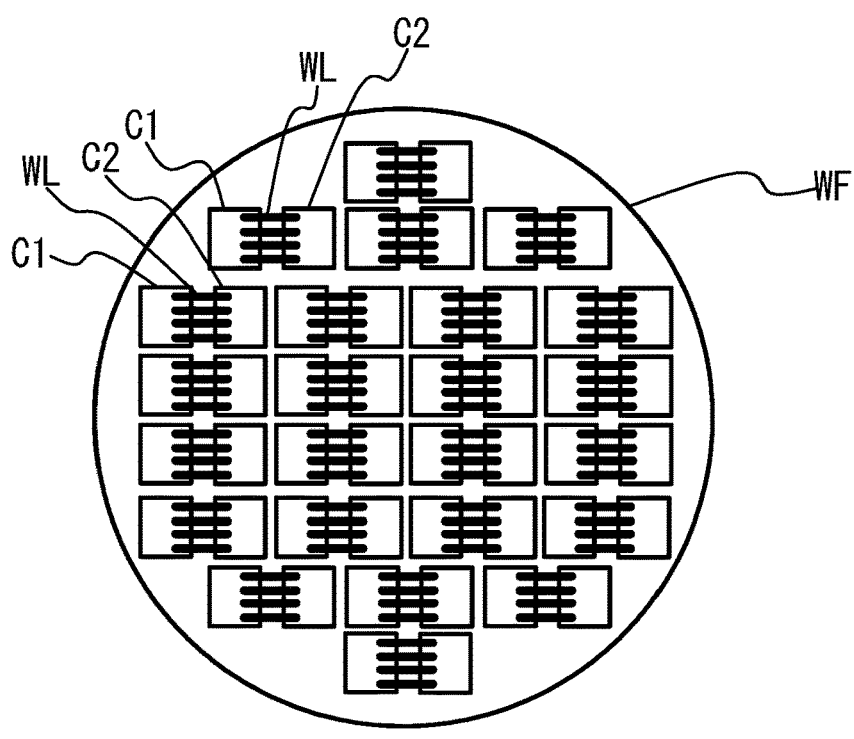
FIG. 6A is a schematic view illustrating a wafer WF in a state where all chips are arranged at designed positions.
Figure 6B:
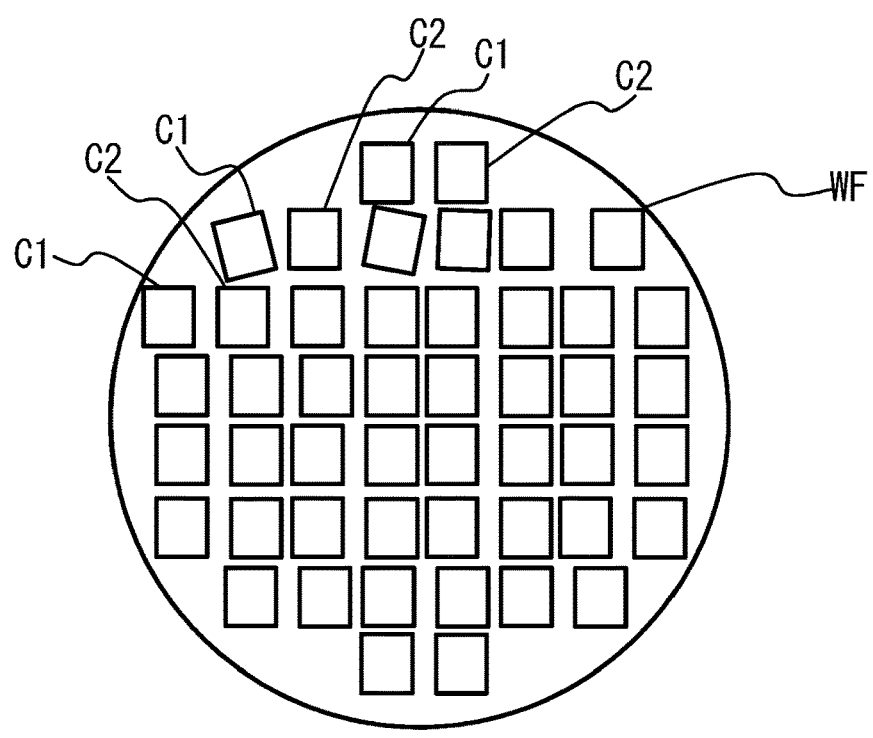
FIG. 6B is a schematic view illustrating the wafer WF in a state where the chips are arranged with being shifted from the design positions.

FIG. 6A is a schematic view illustrating the wafer WF in a state where all chips are arranged at design positions. As illustrated in FIG. 6A, the wiring pattern WL connecting the chip C1 and the chip C2 is exposed (formed) by the exposure apparatus EX. Here, in the FO-WLP, since the chips are fixed with a mold material such as a resin on the wafer WF, as illustrated in FIG. 6B, the position of each chip may be shifted from the design position. In this case, if the DMD 204 is controlled and the wiring pattern is exposed using data indicating the wiring pattern connecting the chips at the design positions (hereinafter, referred to as design value data), the wiring pattern may be shifted from the positions of the pads and a connection defect or a short circuit may occur.

Therefore, in the present embodiment, the alignment system ALG_R or ALG_L measures the positions of predetermined measurement points on the chips included in each of the sets of the chips arranged on the wafer WF. The data generation device 300 calculates the positions of all pads on the chips based on the position measurement results obtained from the alignment system ALG_R or ALG_L, and generates wiring pattern data obtained by correcting a part of the design value data based on the calculation results.

The generated wiring pattern data is stored in the first storage device 310R or the second storage device 310L. The first storage device 310R and the second storage device 310L are, for example, solid state drives (SSDs).

The first storage device 310R stores the wiring pattern data used to control the DMD 204 when exposing the wafer WF placed on the substrate stage 30R. The second storage device 310L stores the wiring pattern data used to control the DMD 204 when exposing the wafer WF placed on the substrate stage 30L. The wiring pattern data stored in the first storage device 310R or the second storage device 310L is transferred to the exposure control device 400.

The exposure control device 400 controls the illumination/projection modules 200 based on the wiring pattern data to expose the wiring patterns on the wafer WF. As illustrated in FIG. 2, in the present embodiment, a plurality of columns (four columns in FIG. 2) including a plurality of the illumination/projection modules 200 are arranged. In FIG. 1, only one column including a plurality of the illumination/projection modules 200 is illustrated for simplification. Further, in FIG. 2, for simplification, the alignment systems ALG_R and ALG_L are not illustrated.

A plurality of the illumination/projection modules 200 are provided so that wiring patterns in different sets can be exposed at once. Although four columns of the illumination/projection modules 200 are provided in FIG. 2, the number of columns of the illumination/projection modules 200 may be one to three, or may be five or more. The number of the illumination/projection modules 200 included in each column is only required to be two or more. In addition, when a plurality of wafers WF are placed on the substrate holder, the different sets exposed at a time by the illumination/projection modules 200 may be different sets in the same wafer WF or may be sets in different wafers WF.

Figures 7A, 7B, 7C, 7D, 7E:
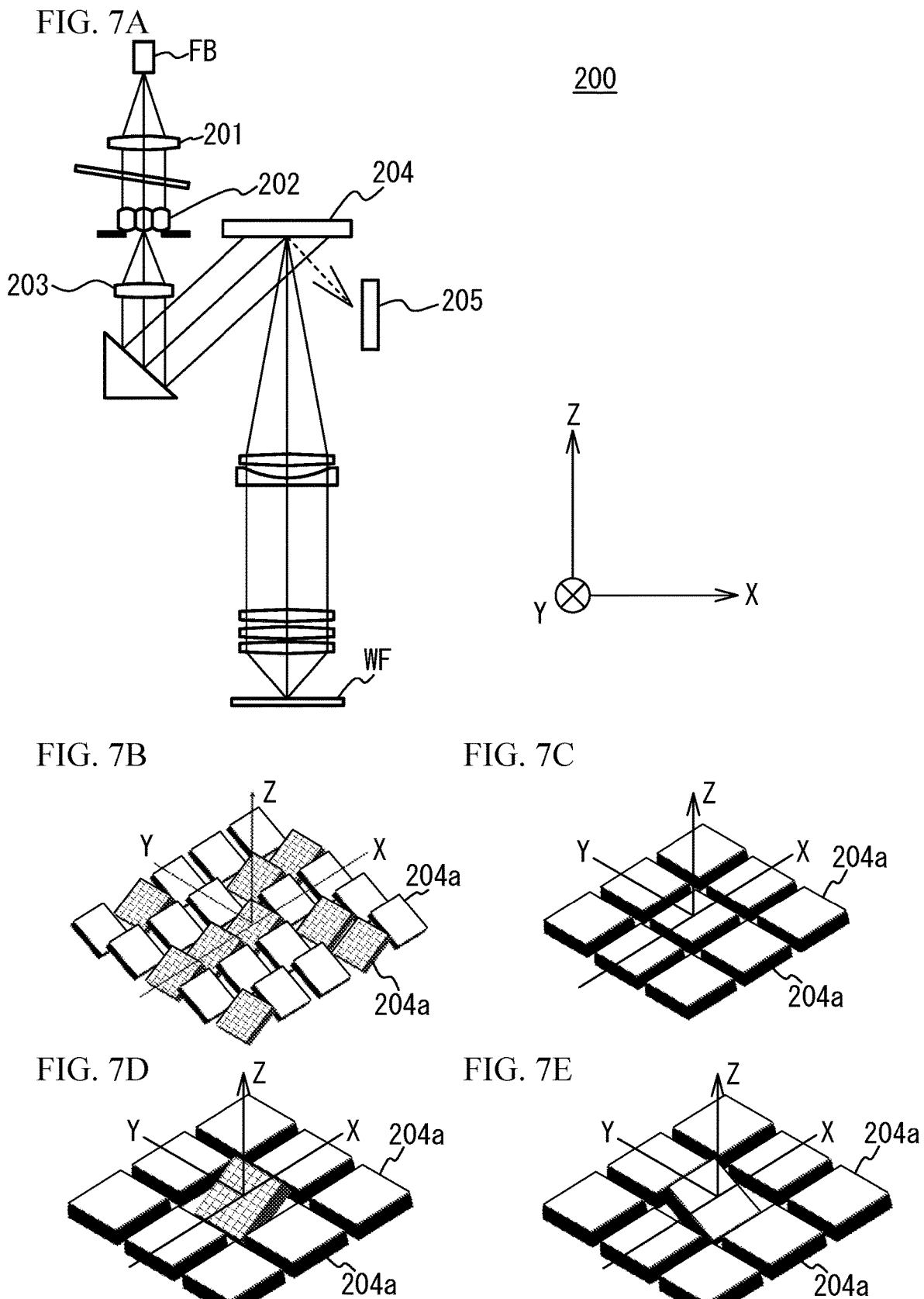
FIG. 7A illustrates an optical system of an illumination/projection module, FIG. 7B schematically illustrates a DMD.
FIG. 7C illustrates the DMD when the power is OFF.
FIG. 7D is a view for describing a mirror in an ON state.
FIG. 7E is a view for describing a mirror in an OFF state.

FIG. 7A is a diagram illustrating an optical system of the illumination/projection module 200. The illumination/projection module 200 includes a collimator lens 201, a fly-eye lens 202, a main condenser lens 203, and the DMD 204.

The laser light emitted from the light source LS (see FIG. 2) is taken into the illumination/projection module 200 through the delivery fiber FB. The laser light passes through the collimator lens 201, the fly-eye lens 202, and the main condenser lens 203 to illuminate the DMD 204 substantially uniformly.

FIG. 7B schematically illustrates the DMD 204, and FIG. 7C illustrates the DMD 204 when the power is off. In FIG. 7B to FIG. 7E, the mirror in the ON state is indicated by hatching.

The DMD 204 has a plurality of micromirrors 204a of which the reflection angles are controlled to be changed. Each micromirror 204a is turned on by tilting around the Y-axis. FIG. 7D illustrates a case where only the center micromirror 204a is in the ON state and other micromirrors 204a are in the neutral state (a state other than the ON state and the OFF state). Each micromirror 204a is turned off by tilting around the X-axis. FIG. 7E illustrates a case where only the center micromirror 204a is in the OFF state and other micromirrors 204a are in the neutral state. The DMD 204 generates an exposure pattern of wiring lines connecting the chips (hereinafter referred to as a wiring pattern) by switching the ON and OFF states of each micromirror 204a.

The illumination light reflected by the mirror in the OFF state is absorbed by an OFF light absorbing plate 205 as illustrated in FIG. 7A. The illumination/projection module 200 has a magnification for projecting one pixel of the DMD 204 in a predetermined size, and can slightly correct the magnification by focusing by Z-axis driving of the lens and driving some of the lenses. The DMD 204 itself can be driven in the X direction, the Y direction, and the θz direction by controlling an X, Y, θ stage (not illustrated) on which the DMD 204 is mounted, and corrects, for example, a deviation from a target value of the substrate stage 30.

Although the DMD 204 has been described as an example of the spatial light modulator and thus as a reflective type that reflects laser light, the spatial light modulator may be a transmissive type that transmits laser light or a diffractive type that diffracts laser light. The spatial light modulator can modulate the laser light spatially and temporally.

Returning back to FIG. 4, the autofocus systems AF are arranged so as to sandwich the illumination/projection module 200. This configuration allows the autofocus system AF to perform measurement before the exposure operation for forming wiring patterns connecting chips arranged on the wafer WF, regardless of the scanning direction of the wafer WF.

The alignment system ALG_C measures the position of the wafer WF placed on the substrate holder PH of the substrate stage 30 before the start of exposure, with reference to the reference mark 60a (see FIG. 8) of the alignment device 60. Normally, in the measurement of the position of each wafer WF, the number of measurement points and the arrangement of the measurement points are determined so that six parameters of the wafer WF placed on the substrate holder PH, i.e., the X-direction shift (X), the Y-direction shift (Y), the rotation (Rot), the X-direction magnification (X_Mag), the Y-direction magnification (Y_Mag), and the orthogonality (Oth) can be calculated. Based on the measurement results by the alignment system ALG_C, the positional shift of the wafer WF with respect to the substrate stage 30 is detected, and the exposure start position and the like are changed.

Figure 8:
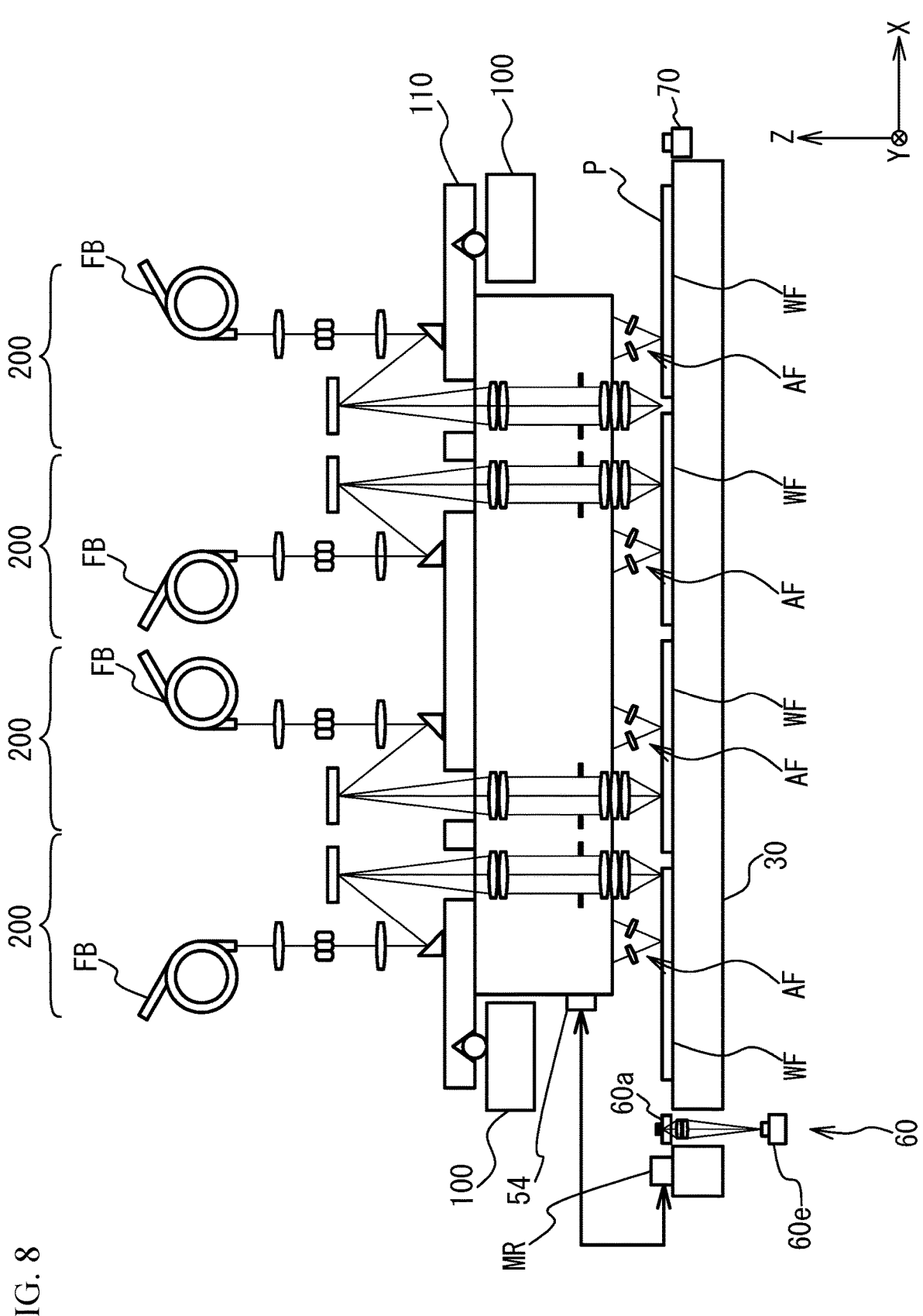
FIG. 8 is an enlarged view of the vicinities of the illumination/projection modules.

FIG. 8 is an enlarged view of the vicinities of the illumination/projection modules 200. As illustrated in FIG. 8, a fixed mirror 54 for measuring the position of the substrate stage 30 is provided near the illumination/projection module 200.

As illustrated in FIG. 8, the substrate stage 30 is provided with the alignment device 60. The alignment device 60 includes the reference mark 60a, a two-dimensional image sensor 60e, and the like. The alignment device 60 is used for measurement and calibration of the positions of various modules, and is also used for calibration of the alignment systems ALG_R, ALG_L, and ALG_C arranged on the optical surface plate 110.

In the measurement and calibration of the position of each module, the position of each module is measured by projecting a DMD pattern for calibration onto the reference mark 60a of the alignment device 60 by the illumination/projection module 200 and measuring the relative position between the reference mark 60a and the DMD pattern.

Further, the calibration of the alignment systems ALG_R, ALG_L, and ALG_C can be performed by measuring the reference mark 60a of the alignment device 60 with the alignment systems ALG_R, ALG_L, and ALG_C. That is, the positions of the alignment systems ALG_R, ALG_L, and ALG_C can be obtained by measuring the reference mark 60a of the alignment device 60 with the alignment systems ALG_R, ALG_L, and ALG_C. Furthermore, the relative position with respect to the position of the module can be obtained using the reference mark 60a.

Although the alignment system ALG_C measures the position of the wafer WF placed on the substrate holder PH of the substrate stage 30 before the start of exposure, using the reference mark 60a (see FIG. 8) of the alignment device 60 as a reference, the measurement by the alignment system ALG_C can be omitted if the positional relationship between the substrate stage 30 and the wafer WF does not change. When the X, Y, θ, and magnification of each wafer WF placed on the substrate holder PH slightly shift, the current state of the wafer WF is measured by the alignment system ALG_C, and the difference from the state of the wafer WF measured by the alignment system ALG_R or ALG_L (the state of the wafer WF used for generating the wiring pattern) is corrected by changing the state of the X, Y, θ stage on which the DMD 204 is mounted and the magnification of the lens. This eliminates the need to rewrite the wiring pattern data, and the process can smoothly transition to exposure.

The substrate stage 30 is provided with a moving mirror MR used to measure the position of the substrate stage 30, a DM monitor 70, and the like.

(Predetermined Measurement Point)

Figure 9A:
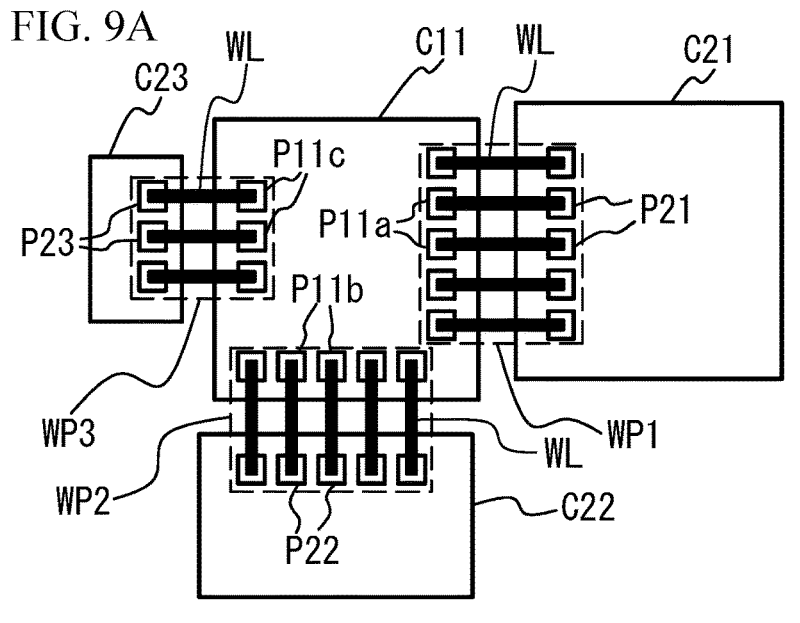
FIG. 9A to FIG. 9C are diagrams illustrating predetermined measurement points on a chip.
Figure 9A:
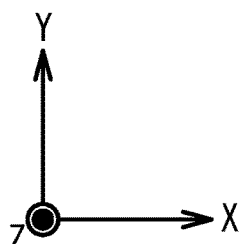
Figure 9B:
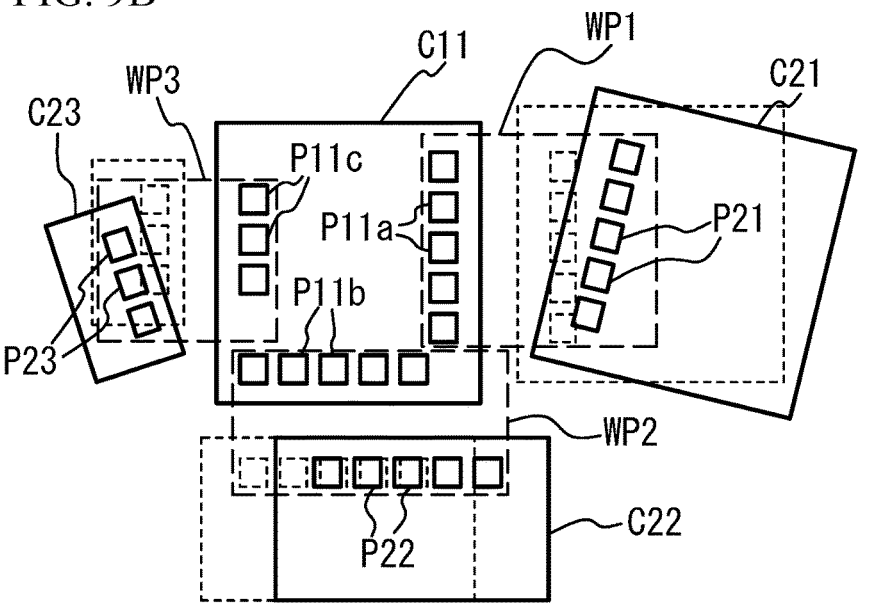
Figure 9B:
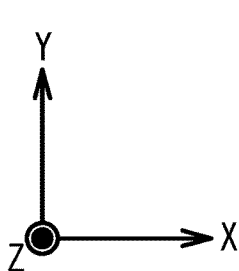
Figure 9C:
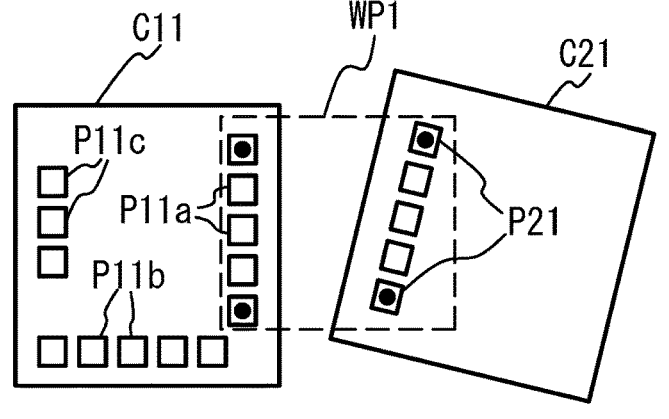
Figure 9C:
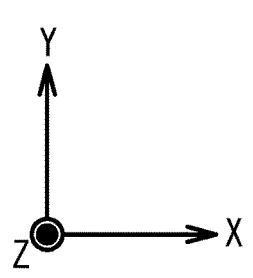

Next, predetermined measurement points on the chip to be measured by the alignment systems ALG_R and ALG_L will be described. FIG. 9A to FIG. 9C are diagrams for describing predetermined measurement points on the chip. FIG. 9A illustrates a case where the chips at the design positions are connected to each other by wiring patterns WL.

As illustrated in FIG. 9A, a case where a chip C11 is connected to each of chips C21 to C23 will be described. More specifically, pads P11a of the chip C11 are connected to pads P21 included in the chip C21, pads P11b of the chip C11 are connected to pads P22 included in the chip C22, and pads P11c of the chip C11 are connected to pads P23 included in the chip C23. In this case, the data generation device 300 generates wiring pattern data for each of a partial wiring portion WP1 connecting the pads P11a of the chip C11 and the pads P21 of the chip C21, a partial wiring portion WP2 connecting the pads P11b of the chip C11 and the pads P22 of the chip C22, and a partial wiring portion WP3 connecting the pads P11c of the chip C11 and the pads P23 of the chip C23.

FIG. 9B is a diagram illustrating an example of the chips C11 and C21 to C23 fixed to the wafer WF with being shifted from the design positions. As illustrated in FIG. 9B, a case where the chips C21 to C23 are fixed to the wafer WF with being shifted from the design positions indicated by dotted lines is considered. In this case, each of the alignment systems ALG_R and ALG_L measures the positions of two pads located at both ends in the arrangement direction of the pads for each of two chips included in the partial wiring portion, for each of the partial wiring portion WP1, the partial wiring portion WP2, and the partial wiring portion WP3.

The partial wiring portion WP1 will be described as an example. FIG. 9C illustrates the pads P11a of the chip C11 and the pads P21 of the chip C21 included in the partial wiring portion WP1.

In the partial wiring portion WP1, each of the alignment systems ALG_R and ALG_L measures the positions of two pads P11a (indicated by black circles in FIG. 9C) located at both ends in the arrangement direction of the pads P11a (Y direction in FIG. 9C) among the pads P11a of the chip C11. That is, the predetermined measurement points on the chip C11 are two pads P11a located at both ends in the arrangement direction of the pads P11a. Further, each of the alignment systems ALG_R and ALG_L measures the positions of two pads P21 located at both ends in the arrangement direction of the pads P21 among the pads P21 of the chip C21 (illustrated by black circles in FIG. 9C). That is, the predetermined measurement points on the chip C21 are two pads P21 located at both ends in the arrangement direction of the pads P21. The positions of the pads P11a located at both ends and the pads P21 located at both ends may be calculated from the amount of movement caused by the movement of the substrate stage 30, or may be measured by imaging the pads P11a located at both ends and the pads P21 located at both ends at once by increasing the field of view of the alignment systems ALG_R and ALG_L.

(Method of Calculating Position of Pad)

The data generation device 300 calculates the positions of all the pads of the pads P11*a* of the chip C11 and the pads P21 of the chip C21 from the positions of the four pads measured as described above.

FIG. 10A illustrates the chip C11 and the chips C21 to C23 fixed to the wafer WF with being shifted from the design positions, and FIG. 10B is an enlarged view of the partial wiring portion WP1. In the example of FIG. 10A, the chip C11 is located at the design position, but the chips C21 to C23 are fixed at positions shifted from the design positions. Therefore, as illustrated in FIG. 10B, the pads P21 are at positions shifted from the design positions of the pads P21 indicated by dotted lines.

As indicated by a chain line in FIG. 10B, a straight line connecting the pads P11*a* and the pads P21 of the measurement points at the design positions has a rectangular shape. The data generation device 300 calculates the positions of all the pads P11*a* and P21 existing in the partial wiring portion WP1 from the relationship between the coordinates of the four corners of the rectangle formed by connecting the pads P11*a* and P21 of the measurement points at the design positions by straight lines and the coordinates of the pads P11*a* and P21 of the measurement points in the partial wiring portion WP1 measured by the alignment system ALG_R or ALG_L.

The data generation device 300 generates wiring pattern data for the partial wiring portion WP11 based on the positions of the pads P11*a* and the pads P21 that have been calculated. Further, the same process is performed for other partial wiring portions WP2 and WP3. Thus, as illustrated in FIG. 10C, the chip C11 and the chips C21 to C23 are connected to each other by the wiring patterns WL.

(Method of Generating Wiring Pattern Data)

Figures 11A, 11B, 11C, 11D, 11E, 11F:
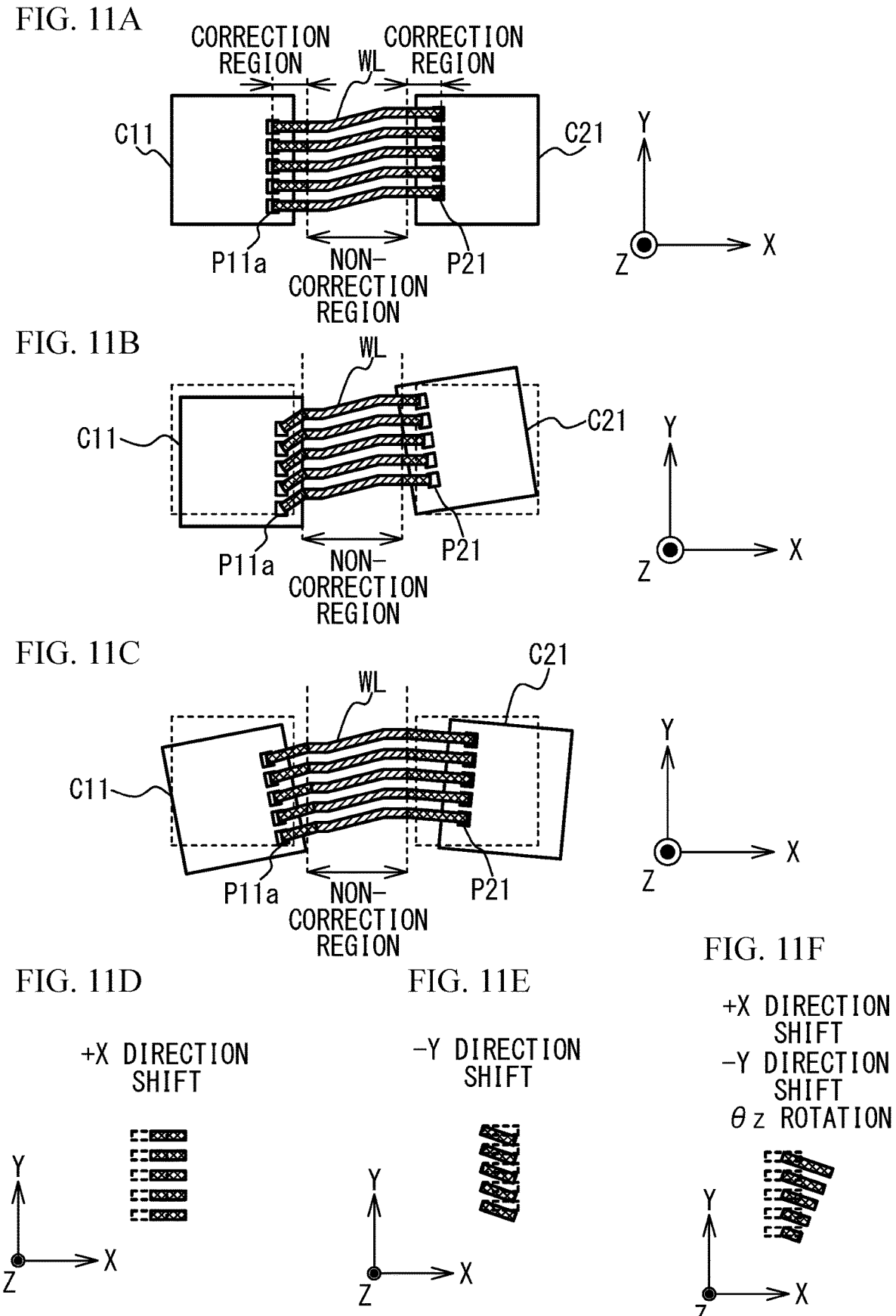
FIG. 11A illustrates a wiring pattern for connecting pads of chips arranged at design positions.
FIG. 11B and FIG. 11C are diagrams for describing an example of a wiring pattern for connecting pads of chips shifted from the design positions.
FIG. 11D to FIG. 11F are diagrams for describing a method of generating a wiring pattern.

Next, a method of generating wiring pattern data executed by the data generation device 300 will be described. FIG. 11A illustrates design value data of the wiring pattern WL that connects the pads of the chip C11 and the chip C21 arranged at the design positions. In FIG. 11B and FIG. 11C, the design positions of the chip C11 and the chip C21 are indicated by dotted lines.

FIG. 11B illustrates an example of the chip C11 and the chip C21 fixed on the wafer WF with being shifted from the design positions. In the case of FIG. 11B, the chip C21 is shifted from the design position in the +X direction and the −Y direction, and the chip C21 is rotated from the design position around the Z-axis.

If the data of the wiring pattern connecting the chip C11 and the chip C21 located at positions shifted from the design positions is generated from scratch, it takes a long time. Therefore, in the present embodiment, as illustrated in FIG. 11A, the design value data is divided into a correction region and non-correction regions, and data of a wiring pattern of the correction region is generated and used as the wiring pattern data.

For example, in the case of FIG. 11B, the data generation device 300 generates data of the wiring pattern (indicated by cross-hatching) connecting the pads P11*a* of the chip C11 and the wiring lines in the non-correction region and data of the wiring pattern (indicated by cross-hatching) connecting the pads P21 of the chip C21 and the wiring lines in the non-correction region as wiring pattern data.

For example, FIG. 11C illustrates a case where the chip C11 is shifted from the design position in the +X direction and the −Y direction and is rotated around the Z-axis, and the chip C21 is shifted from the design position in the +X direction and is rotated around the Z-axis. In this case, the data generation device 300 generates data of the wiring pattern (indicated by cross-hatching) that connects the pads P11*a* of the chips C11 to the corresponding wiring lines in the non-correction region and data of the wiring pattern (indicated by cross-hatching) that connects the pads P21 of the chip C21 to the corresponding wiring lines in the non-correction region, as illustrated in FIG. 11C.

This makes it possible to reduce the time required to generate the wiring pattern data and to reduce the size of the wiring pattern data, thereby achieving reduction in the time required to transfer the wiring pattern data to the first storage device 310R or the second storage device 310L.

The wiring pattern data in the correction region may be generated using data of the predefined wiring pattern according to the shift patterns of the chips C11 and C21 from the design positions as illustrated in FIG. 11D to FIG. 11F.

For example, when the chip C21 is shifted in the +X direction, as illustrated in FIG. 11D, in the correction region at the chip C21 side, the wiring pattern obtained by shifting the design wiring pattern indicated by the dotted line in the +X direction is used. When the chip C21 is shifted in the −Y direction, as illustrated in FIG. 11E, a wiring pattern obtained by rotating the design wiring pattern indicated by the dotted line around the Z-axis is used in the correction region at the chip C21 side. When the chip C21 is shifted in the +X direction and the −Y direction and rotated around the Z-axis, as illustrated in FIG. 11F, in the correction region at the chip C21 side, a wiring pattern obtained by shifting the design wiring pattern indicated by the dotted line in the +X direction, rotating the design wiring pattern around the Z-axis, and increasing or reducing the length of each wiring line according to the rotated angle of the chip C21 is used. This further reduces the computation time.

The exposure control device 400 controls the DMD 204 using the data obtained by replacing the data in the correction region of the design value data with the wiring pattern data generated by the data generation device 300 to expose the wiring pattern. Thus, even when the actual chip position on the wafer WF or the substrate P is shifted from the design position, the wiring pattern for connecting the chips can be formed.

The method of generating the wiring pattern data is not limited to the above-described method. The wiring pattern data may be generated without dividing the design value data into the correction region and the non-correction region. For example, it is assumed that design value data of the wiring pattern WL is set as illustrated in FIG. 12A. Here, when the chip C11 and the chip C21 are shifted from the design positions, the wiring pattern data defining that wiring lines extending from the pads of the chip C11 to the center along the X direction and the wiring lines extending from the pads of the chip C21 to the center along the X direction are connected to each other on any Y-axis as illustrated in FIG. 12B may be generated. Alternatively, for example, in the case where wiring lines overlap with each other when the wiring lines are connected according to the method in FIG. 12B, the connection positions may be made to be different as illustrated in FIG. 12C. As described above, when the design value data indicates the wiring lines parallel to the X-axis as illustrated in FIG. 12A, the length in the X-direction of the wiring line extending from each pad toward the center along the X-direction is changed based on the X-coordinate of each pad whose position is measured. Then, the distance in the Y direction between the pads to be connected by the wiring line is calculated based on the Y coordinate of each pad, and the ends at the center side of the wiring lines extending from respective pads along the X direction are connected by the wiring line that is parallel to the Y axis and has a length equal to the calculated distance. In this manner, the wiring pattern data can be easily generated. It is desirable that which of the following methods: the method of generating wiring pattern data from scratch based on the measured positions of the pads and wiring as illustrated in FIG. 10A to FIG. 10C, the method of generating wiring pattern data from the design value data by dividing the design value data into the correction region and the non-correction region and wiring as illustrated in FIG. 11A to FIG. 11F, and the method of generating wiring pattern data obtained by correcting the positional shifts in the X-direction and the Y-direction of each pad by the length of the wiring line in each direction and wiring as illustrated in FIG. 12A to FIG. 12C is to be used is selectable according to the exposure recipe (setting information).

Figure 13:
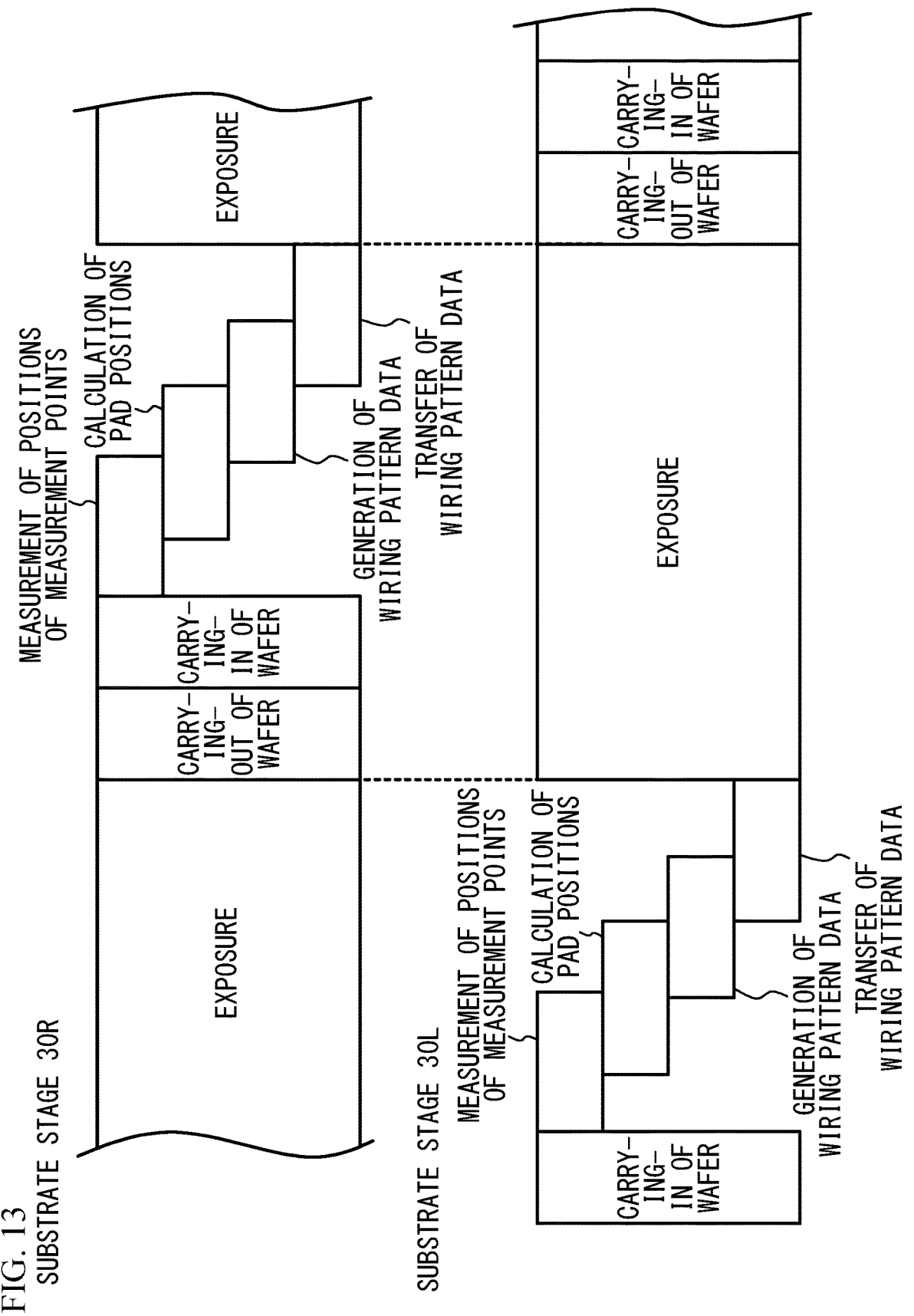
FIG. 13 is a conceptual diagram illustrating a procedure of forming wiring patterns of the FO-WLP in the exposure apparatus.

Next, an example of a procedure for forming wiring patterns of the FO-WLP in the exposure apparatus EX according to the present embodiment will be described. FIG. 13 is a conceptual diagram of a procedure for forming wiring patterns of the FO-WLP in the exposure apparatus EX.

As illustrated in FIG. 13, in the present embodiment, for example, while the wafers WF on the substrate stage 30R are being exposed, the wafers WF are carried into the substrate stage 30L, and the positions of predetermined measurement points on the chips are measured by the alignment system ALG_L. Based on the position measurement results of the predetermined measurement points on the chips by the alignment system ALG_L, the data generation device 300 calculates the positions of the pads on the chips, and sequentially generates wiring pattern data based on the calculation results. The data generation device 300 stores (transfers) the generated wiring pattern data in the second storage device 310L. The wiring pattern data stored in the second storage device 310L is sequentially transferred to the exposure control device 400 in accordance with the start of exposure of the wafers WF on the substrate stage 30L.

In the case that 4 rows×1 column of the wafers WF are arranged on one tray TR as illustrated in FIG. 2, the tray TR may be placed on the substrate stage 30L when four wafers WF are finished being placed on the substrate stage 30L, and the measurement of the positions of the predetermined measurement points on the chips may be started by the alignment system ALG_L. In this case, the measurement of the positions of the predetermined measurement points by the alignment system ALG_L and the placement of other wafers WF onto the next tray TR can be performed in parallel. Then, in parallel with the process of placing the tray TR on which other wafers WF are arranged on the substrate stage 30L, the process of calculating the pad positions of the wafers WF for which the measurement of the positions of the predetermined measurement points has been completed and generating the wiring pattern data based on the measurement results by the alignment system ALG_L, and storing the generated wiring pattern data in the second storage device 310L can be performed. Such parallel processing is particularly effective when it takes time to generate, transfer, and store wiring pattern data. If the time required to measure the positions of the measurement points and generate and store the wiring pattern data is shorter than the exposure time, for example, 4 rows×3 columns of the wafers WF may be placed on one tray TR, and then loaded onto the substrate stage 30L, and measured by the alignment system ALG_L.

On the other hand, when the exposure of the wafers WF on the substrate stage 30L is started, the exposed wafers WF on the substrate stage 30R are carried out, and then new wafers WF are carried onto the substrate stage 30R. Thereafter, the positions of predetermined measurement points on the chips are measured by the alignment system ALG_R. The data generation device 300 calculates the positions of the pads on the chips based on the measurement results of the positions of the predetermined measurement points on the chips, and sequentially generates wiring pattern data based on the calculation results. The data generation device 300 transfers the generated pattern data to the first storage device 310R. The wiring pattern data stored in the first storage device 310R is sequentially transferred to the exposure control device 400 in accordance with the start of exposure of the wafers WF on the substrate stage 30R.

As described above, in the present embodiment, while exposure processing is performed using one of the two substrate stages 30R and 30L, carrying-out of exposed wafers, carrying-in of new wafers, measurement of the positions of predetermined measurement points, calculation of pad positions, and generation and transfer of the wiring pattern data are performed on the other substrate stage.

As described above in detail, the exposure apparatus EX according to the first embodiment includes the DMD 204 that generates the wiring pattern that connects the pads P11$a$ of the chip C11 arranged on the wafer WF and the pads P21 of the chip C21 arranged on the wafer WF. The exposure apparatus EX includes the data generation device 300 that acquires the position measurement results of the predetermined measurement points on the chip C11 and the position measurement results of the predetermined measurement points on the chip C21, calculates the positions of all the pads P11$a$ and P21 based on the acquired position measurement results and the design information of the pads P11$a$ and the pads P21, determines a wiring pattern for connecting the pads P11 and the pads P21, and generates wiring pattern data used to control the DMD 204 when forming the determined wiring pattern. The exposure apparatus EX further includes the exposure control device 400 that controls the DMD 204 using the wiring pattern data to expose the wiring pattern that connects the pads P11 and the pads P21. Since the data generation device 300 calculates the positions of all the pads P11 and P21 based on the position measurement results of the predetermined measurement points, it is possible to reduce the time until the positions of all the pads P11 and P21 are specified, compared to a case where the positions of all the pads P11 and P21 are measured. Therefore, the time required to form the wiring pattern can be reduced. The time required to form the wiring pattern includes at least one of the following: the time required to carry in the wafer WF, the time required to measure the positions of the predetermined measurement points, the time required to calculate the positions of the pads, the time required to generate and transfer the wiring pattern data, the time required for the exposure process, and the time required to carry out the exposed wafer WF.

In the first embodiment, the predetermined measurement points on the chip C11 are some of the pads P11$a$, and the predetermined measurement points on the chip C21 are some of the pads P21. Since the pads P11$a$ of the chip C11 and the pads P21 of the chip C21 are used as measurement points, it is not necessary to separately provide measurement points on the chip.

In the first embodiment, the pads P11$a$ as the measurement points are located at both ends in the arrangement direction of the pads P11$a$, and the pads P21 as the measurement points are located at both ends in the arrangement direction of the pads P21. Thus, for example, the calculation accuracy of the position of the pad is improved as compared with the case where the position of the pad is calculated by measuring the positions of the adjacent pads P11$a$ and the adjacent pads P21.

In the first embodiment, the wiring pattern determined by the data generation device 300 is a wiring pattern obtained by changing a part of the wiring pattern connecting the pads P11$a$ and P21 at the design positions. This makes it possible to reduce the time required to generate the wiring pattern data and to reduce the size of the wiring pattern data, thereby achieving reduction in the time required to transfer the wiring pattern data to the first storage device 310R or the second storage device 310L that stores the wiring pattern data.

In the first embodiment above, while the exposure process is being performed using one of the two substrate stages 30R and 30L, carrying-out of the exposed wafers, carrying-in of new wafers, measurement of positions of predetermined measurement points on chips, calculation of pad positions, and generation and transfer of the wiring pattern data are performed in the other substrate stage, but this does not intend to suggest any limitation. While the exposure process is being performed using one of the two substrate stages 30R and 30L, it is only required to perform at least one of the following operations: carrying-out of exposed wafers, carrying-in of new wafers, measurement of the positions of predetermined measurement points on chips, calculation of pad positions, and generation and transfer of wiring pattern data in the other substrate stage.

In the first embodiment above, the pads located at both ends in the arrangement direction of the pads among the pads included in each of the chips to be connected to each other are set as the predetermined measurement points, but this does not intend to suggest any limitation. At least two pads of the pads may be set as the predetermined measurement points. Alternatively, all the pads may be set as the predetermined measurement points. Even when the pads are not in a straight line, the actual positions of the pads can be calculated from the relationship between the design coordinates of the pads.

(Variation)

The data generation device 300 may generate drive data defining the drive amount of the DMD 204 and the drive amount of the lens actuators. That is, the DMD 204 may generate the wiring pattern using the design value data, and the shape of the wiring pattern formed on the wafer WF may be changed by changing the drive amount of the DMD 204 and the drive amount of the lens actuators to change the position of the projected image of the wiring pattern projected onto the wafer WF.

Figure 14A:
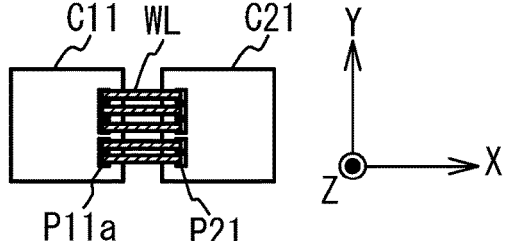
FIG. 14A illustrates a wiring pattern for connecting pads of chips arranged at the design positions.

FIG. 14A illustrates the wiring pattern WL connecting the pads of the chips C11 and C21 arranged at the design positions.

Figure 14B:
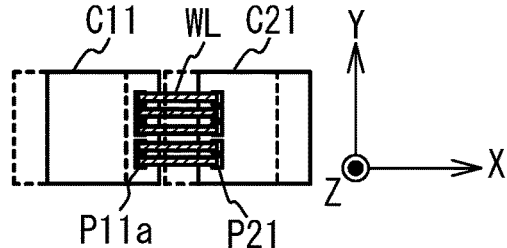
FIG. 14B to FIG. 14G are diagrams for describing examples of a method of forming a wiring pattern for connecting pads of chips shifted from the design positions.

FIG. 14B illustrates a case where the chip C11 and the chip C21 are shifted in the +X direction from the design positions. In this case, the wafer is exposed while being scanned in the X direction after the position of the DMD 204 is shifted in the +X direction, and thereby, as illustrated in FIG. 14B, the wiring pattern WL connecting the chip C11 and the chip C21 is formed.

Figure 14C:
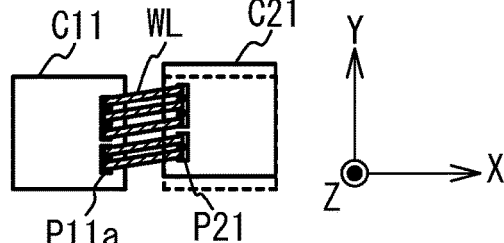

FIG. 14C illustrates a case where the chip C21 is shifted in the +Y direction from the design position indicated by the dotted line. In this case, by scanning and exposing the wafer in the X direction while shifting the position of the DMD 204 in the +Y direction, as illustrated in FIG. 14C, the oblique wiring pattern WL connecting the chip C11 and the chip C21 can be formed.

Figure 14D:
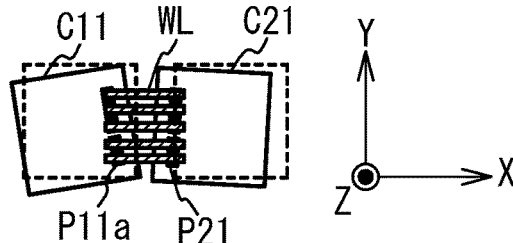

FIG. 14D illustrates a case where the chip C11 is rotated from the design position, and the chip C21 is shifted in the −X direction from the design position and is rotated. In this case, the wiring pattern WL connecting the chip C11 and the chip C21 can be formed without changing the drive data, and thus it is not necessary to change the drive data.

Figure 14E:
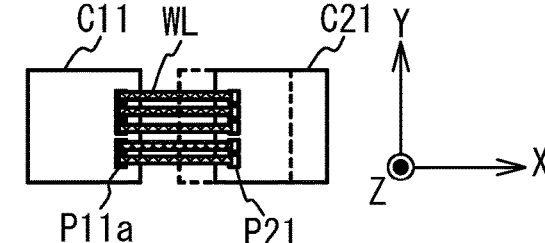

FIG. 14E illustrates a case where the chip C21 is shifted in the +X direction from the design position while the position of the chip C11 remains at the design position. In this case, by scanning and exposing the wafer in the X direction while shifting the DMD 204 in the +X direction, as illustrated in FIG. 14E, the wiring pattern WL longer than the design value can be formed.

Figure 14F:
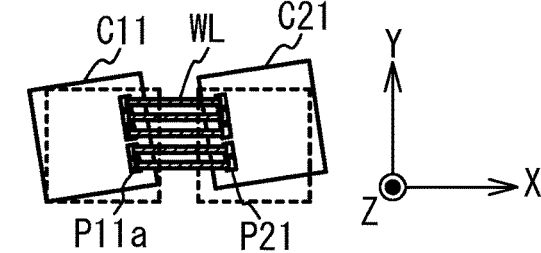

FIG. 14F illustrates a case where the chip C11 and the chip C21 are rotated from the design positions. In this case, the wiring pattern WL having the shape illustrated in FIG. 14F can be formed by rotating the DMD 204 about the Z-axis and then scanning and exposing the wafer in the X direction while shifting the DMD 204 in the −Y-direction.

Figure 14G:
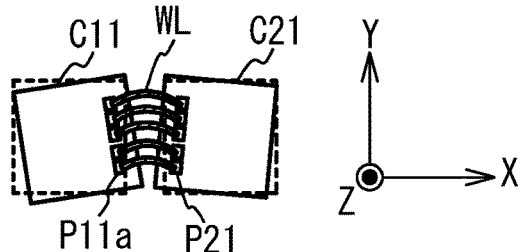

FIG. 14G illustrates a case where the chip C11 is shifted in the +X direction from the design position and rotated, and the chip C21 is shifted in the −X direction from the design position and rotated. In this case, by scanning and exposing the wafer in the X direction while moving the DMD 204 in an arc, the arc-shaped wiring pattern WL illustrated in FIG. 14G can be formed.

Second Embodiment

Figures 15A, 15B, 15C, 15D:
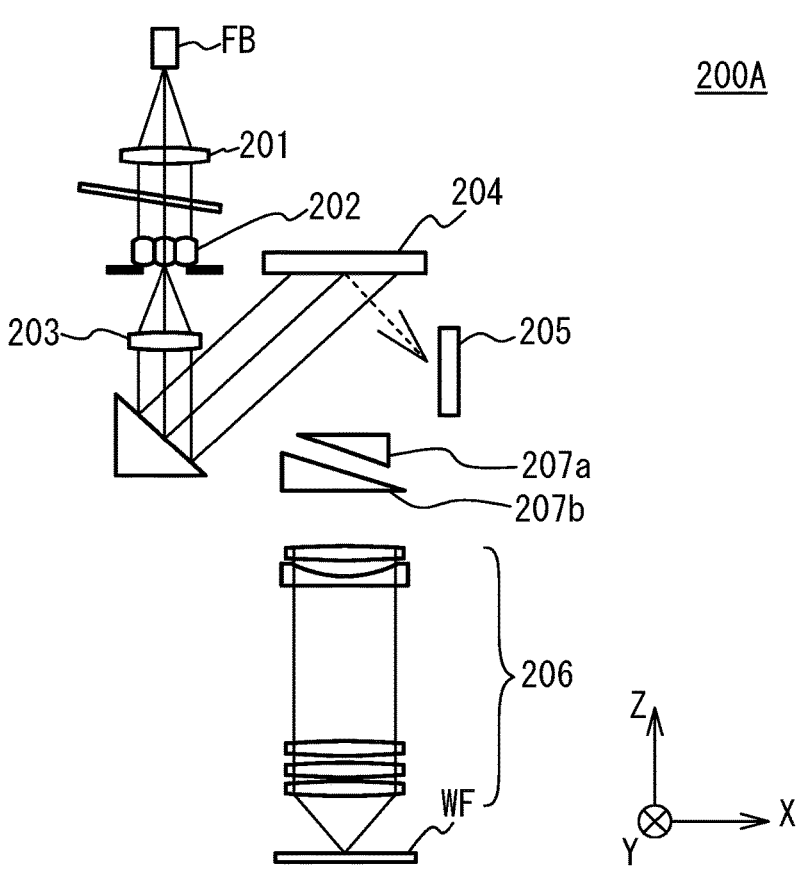
FIG. 15A illustrates a configuration of an illumination/projection module in accordance with a second embodiment.
FIG. 15B to FIG. 15D are diagrams for describing correction of a wiring pattern by a pair of prisms.

The shape of the wiring pattern may be changed by optically correcting the image of the wiring pattern. FIG. 15A is a diagram illustrating a configuration of an illumination/projection module 200A in accordance with a second embodiment.

As illustrated in FIG. 15A, in the illumination/projection module 200A according to the second embodiment, a pair of wedge-shaped prisms 207$a$ and 207$b$ is placed between the DMD 204 and a lens group 206. By controlling the position and orientation of the pair of prisms 207$a$ and 207$b$, the image of the wiring pattern generated by the DMD 204 based on the design value data can be optically deformed.

For example, as illustrated in FIG. 15B, the position of the image can be shifted in the X direction by changing the distance between the prisms 207$a$ and 207$b$ in the Z direction. Further, as illustrated in FIG. 15C, the length of the image in the X direction can be changed by rotating the prism 207$a$ around the Y-axis. Further, by rotating the prism 207$a$ around the X-axis and changing the distance in the Z direction between the prisms 207$a$ and 207$b$ in the Y-direction (for example, the distance between the prisms 207$a$ and 207$b$ in the Z direction increases as the Y-coordinate increases), the shift amount of the image in the X direction can be increased as the Y-coordinate increases, as illustrated in FIG. 15D. In the following description, the operation of setting the prisms 207$a$ and 207$b$ so as to be in the positional relationship illustrated in FIG. 15D is referred to as orthogonality correction.

In this case, the data generation device 300 generates control data (hereinafter, referred to as correction optical system control data) for controlling the position and orientation of the pair of prisms 207$a$ and 207$b$ at the time of exposure of the wiring pattern.

The deformation of the image of the wiring pattern using the pair of prisms 207$a$ and 207$b$ will be further described. FIG. 16A illustrates the wiring pattern WL connecting the pads of the chips C11 and C21 arranged at their design positions.

FIG. 16B illustrates a case where the chips C11 and C21 are shifted in the +X direction from the design positions indicated by the dotted lines. In this case, as illustrated in FIG. 15B, the wiring pattern WL connecting the chips C11 and C21 can be formed by shifting the image in the +X direction.

FIG. 16C illustrates a case where the chip C21 is shifted in the +Y direction from the design position indicated by the dotted line. In this case, the oblique wiring pattern WL connecting the chip C11 and the chip C21 can be formed by the orthogonality correction by the prisms 207*a* and 207*b* described in FIG. 15D.

FIG. 16D illustrates a case where the chip C11 is rotated around the Z-axis from the design position, and the chip C21 is shifted in the −X direction from the design position and is rotated around the Z-axis. In this case, the wiring pattern WL connecting the chip C11 and the chip C21 can be formed by correcting the X magnification while scanning the wafer in the Y direction.

FIG. 16E illustrates a case where the chip C21 is shifted in the +X direction from the design position while the position of the chip C11 remains at the design position. In this case, by correcting the X magnification by the prisms 207*a* and 207*b* and scanning and exposing the wafer in the X direction while shifting the DMD 204 in the +X direction, the wiring pattern WL longer than the design value can be formed as illustrated in FIG. 16E.

FIG. 16F illustrates a case where the chip C11 and the chip C21 are rotated from the design positions. In this case, the wiring pattern WL illustrated in FIG. 16F can be formed by rotating the DMD 204 around the Z-axis and then performing orthogonality correction and rotation correction by the prisms 207*a* and 207*b*.

Other configurations are the same as those of the first embodiment, and therefore, detailed description thereof will be omitted, but also in the second embodiment, while the wafer WF on the substrate stage 30R is being exposed, measurement of the chip positions on the substrate placed on the substrate stage 30L and generation and transfer of the correction optical system control data based on the measurement result are performed.

In the second embodiment, the exposure apparatus EX includes a pair of prisms 207*a* and 207*b* that optically correct the wiring pattern generated by the DMD 204. The data generation device 300 acquires the position measurement results of the predetermined measurement points on the chip C11 and the position measurement results of the predetermined measurement points on the chip C21, calculates the positions of all of the pads P11*a* and P21 based on the acquired position measurement results and the design information of the pads P11*a* and the pads P21, and generates the correction optical system control data, which is used to control the prisms 207*a* and 207*b* to form the wiring pattern connecting the pads P11*a* and the pads P21, based on the calculation results. The exposure control device 400 exposes the wiring pattern connecting the pads P11*a* and the pads P21 by controlling the DMD 204 based on the design value data for generating the wiring pattern connecting the pads P11*a* and P21 at the design positions and controlling the prisms 207*a* and 207*b* using the correction optical system control data. Even when the exposure apparatus EX is configured as in the second embodiment, the time required to form the wiring pattern can be reduced as a whole, as in the first embodiment.

Third Embodiment

Since the step of bonding the chips to the wafer WF is performed before the wiring pattern is formed in the exposure apparatus EX, the data generation device 300 may generate the wiring pattern data, the drive data, or the correction optical system control data by using measurement data of the positions of the pads measured in the inspection step of inspecting the positions of the chips with respect to the wafer WF.

Figure 17:
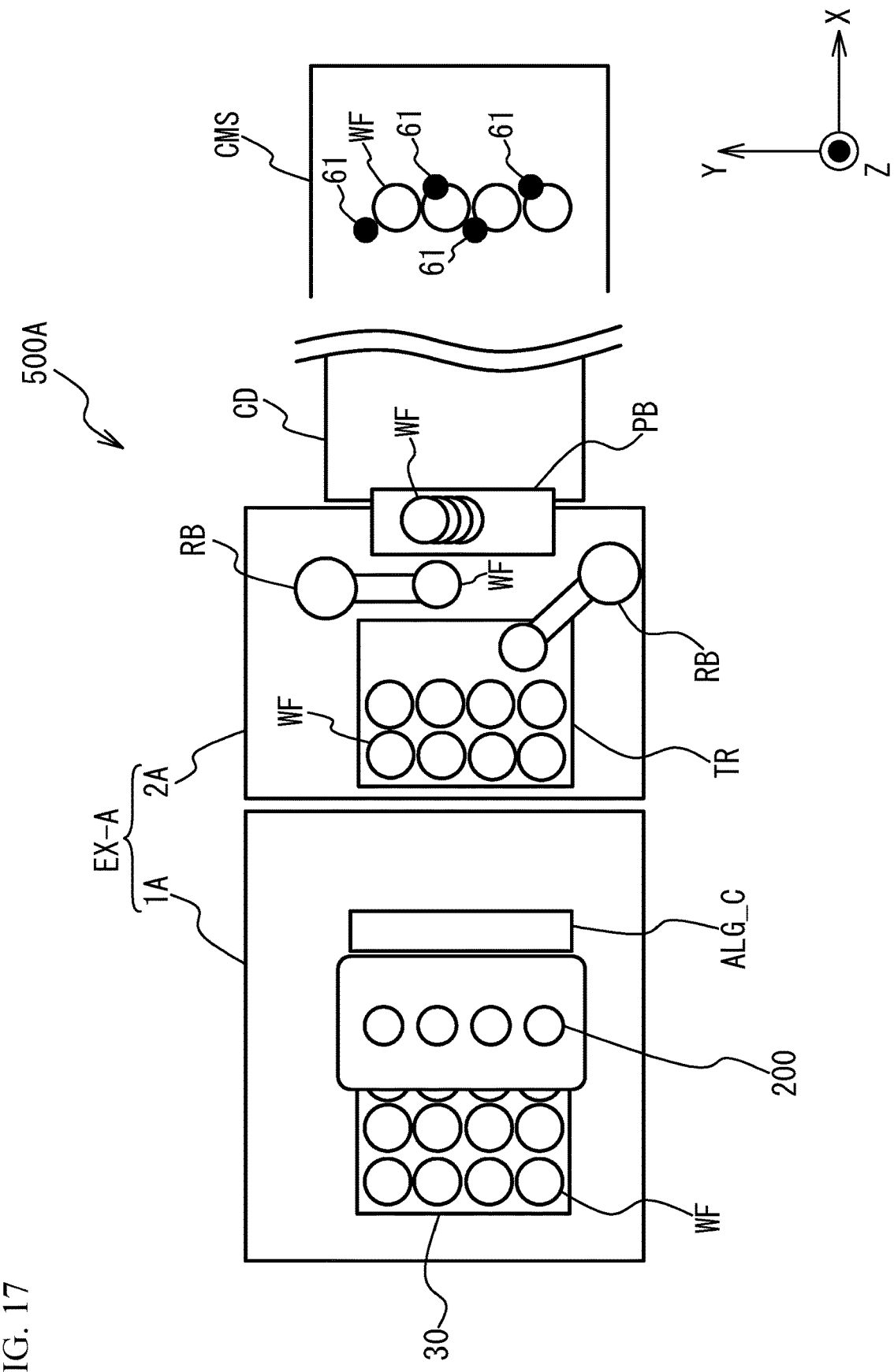
FIG. 17 is a top view illustrating an outline of a wiring pattern formation system in accordance with a third embodiment.

FIG. 17 is a top view illustrating an outline of a wiring pattern formation system 500A according to a third embodiment. The wiring pattern formation system 500A in accordance with the third embodiment includes a chip measurement station CMS for measuring the positions of chips on the wafer WF.

The chip measurement station CMS includes a plurality of measurement microscopes 61, and measures the positions of predetermined measuring points on the chips in different sets. Here, the positions of the predetermined measurement points on the chips in the different sets measured by the measurement microscopes 61 may be the positions of the predetermined measurement points on the chips in the different sets on the same wafer WF or the positions of the predetermined measurement points on the chips in the respective sets on different wafers WF. In the present embodiment, the measurement microscopes 61 measure the positions of predetermined measurement points on the chips in each set on different wafers WF. The number of the measurement microscopes 61 and the number of wafers measured at a time in the chip measurement station CMS depend on the processing capacity of the chip measurement station CMS. Therefore, for example, in the case that one processing device that processes measurement results of the measurement microscopes 61 is provided, when the processing capacity of the processing device is insufficient, one processing device that processes the measurement results of the measurement microscope 61 may be provided for one measurement microscope 61, and a plurality of pairs of the measurement microscope 61 and the processing device may be provided.

The position measurement results of the predetermined measurement points are transmitted to the data generation device 300. The data generation device 300 calculates the positions of all the pads based on the position measurement results of the predetermined measurement points received from the chip measurement station CMS, and generates wiring pattern data (which may be drive data or correction optical system control data) based on the calculation results. The wiring pattern data generated here may be data of a wiring pattern in the correction region as described in the first embodiment, or may be data of a wiring pattern including the correction region and the non-correction region. The wiring pattern data generated by the data generation device 300 is stored in a storage device different from the storage device in which the wiring pattern data used for the control of exposure of the substrate currently being exposed is stored. That is, when the wiring pattern data used for the control of exposure of the wafer WF currently being exposed is stored in the first storage device 310R, the data generation device 300 stores (transfers) the generated wiring pattern data in the second storage device 310L. In the case where it takes time to generate the wiring pattern data, the wiring pattern data can be generated and transferred while a resist is being applied by the coater/developer device CD, and therefore, it is effective to have two storage devices as in the present embodiment, and if necessary, the number of storage devices may be expanded to three or more.

In an exposure apparatus EX-A according to the third embodiment, a main unit 1A includes one substrate stage 30. In the third embodiment, since the chip positions are measured by the chip measurement station CMS, the alignment systems ALG_L and ALG_R can be omitted.

The wafer WF for which the measurement of the positions of the predetermined measurement points on the chips has been completed is coated with a photosensitive resist by the coater/developer device CD, and then is carried into the buffer section PB. The wafers WF placed in the buffer section PB are arranged in a plurality (4 wafers×3 columns in the third embodiment) on one tray TR by the robot RB installed in a substrate exchange unit 2A, carried into the main unit 1A, and placed on the substrate holder of the substrate stage 30.

The alignment system ALG_C measures the position of each wafer WF with respect to the substrate holder, and corrects the exposure start position and the like. When the positions of the chips are shifted from the positions defined in the wiring pattern data generated by the data generation device 300 because the wafer WF is rotated around the Z-axis at the time of placing the wafer WF on the substrate holder, there is a possibility that the chips are not connected correctly when the wiring lines are formed using the wiring pattern data.

In this case, the data generation device 300 can correct the shape of the wiring pattern so that the chips are connected to each other by generating the drive data or the correction optical system control data as described in the first embodiment and the variations thereof. For example, the data generation device 300 detects, from the position of each wafer WF measured by the alignment system ALG_C, the positional shift of each chip from the position defined in the wiring pattern data based on the positions of the chips with respect to the position of the corresponding wafer WF measured by the chip measurement station CMS. The data generation device 300 generates drive data or correction optical system control data based on the shift. Thus, even when the wafer WF is rotated around the Z-axis at the time of placing the wafer WF on the substrate holder, it is not necessary to rewrite the wiring pattern data, and therefore, transition to the exposure can be smoothly performed, and the wiring lines for connecting the chips can be formed.

The alignment system ALG_C may use an alignment mark on the chip for the position measurement of the wafer WF.

Fourth Embodiment

The wafer WF may be attached to the base substrate B, and the position of each chip with respect to the base substrate B may be measured in the chip measurement station CMS.

Figure 18:
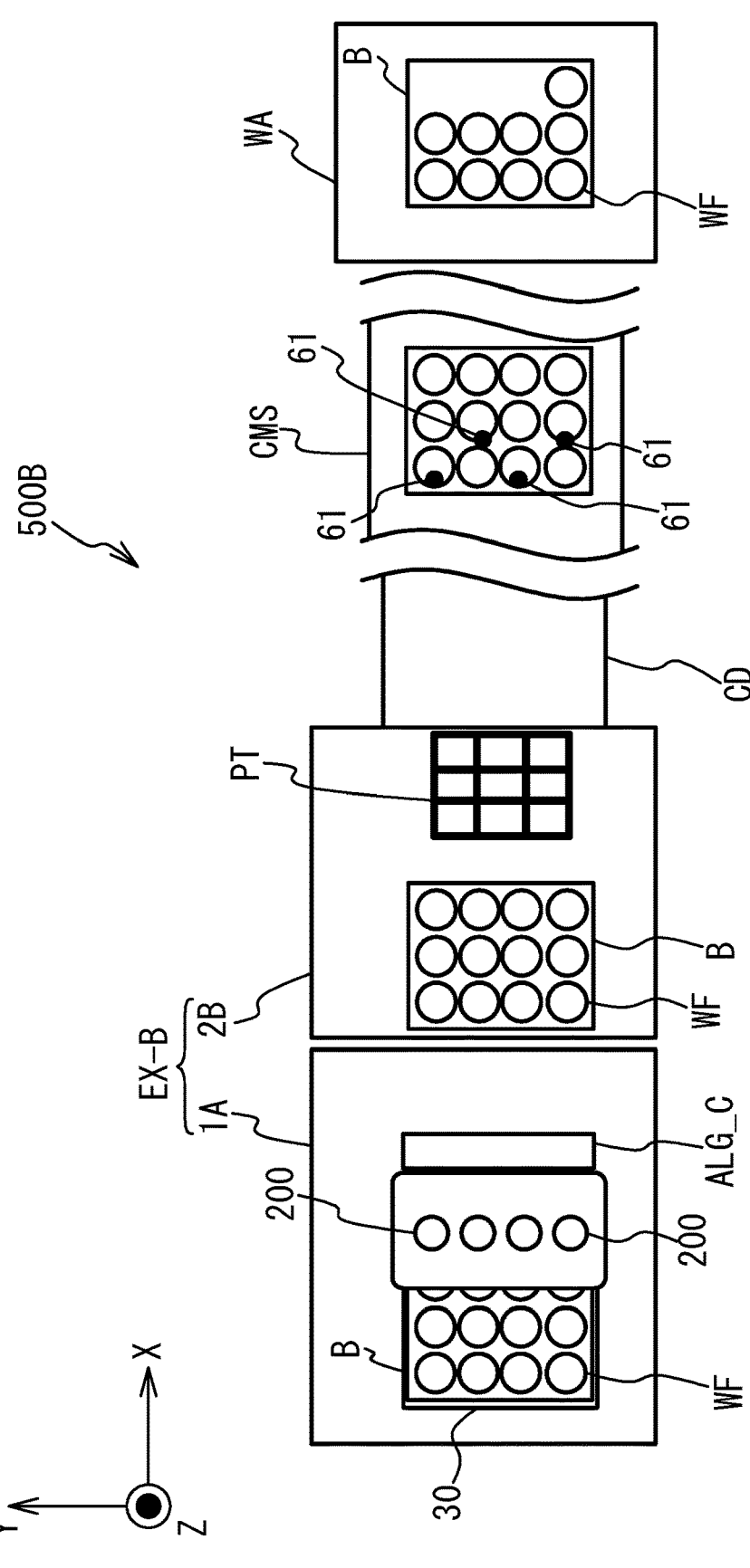
FIG. 18 is a top view illustrating an outline of a wiring pattern formation system in accordance with a fourth embodiment.

FIG. 18 is a top view illustrating an outline of a wiring pattern formation system 500B in accordance with a fourth embodiment. The wiring pattern formation system 500B according to the fourth embodiment includes a wafer arrangement device WA for bonding a plurality of wafers WF on which the chips are arranged to a base substrate B, the chip measurement station CMS, and an exposure apparatus EX-B. The wafer arrangement device WA is for preventing the position of the wafer WF with respect to the base substrate B from being changed.

The base substrate B to which the wafers WF are attached by the wafer arrangement device WA is carried into the chip measurement station CMS.

The chip measurement station CMS includes a plurality of the measurement microscopes 61, and measures the positions of predetermined measurement points on each chip with respect to the base substrate B. The plurality of the measurement microscopes 61 measure the positions of predetermined measurement points on the chips in different sets. The position measurement results of the predetermined measurement points are transmitted to the data generation device 300.

The data generation device 300 calculates the positions of all pads on each chip based on the position measurement results of the predetermined measurement points received from the chip measurement station CMS, and generates wiring pattern data (which may be drive data or correction optical system control data) based on the calculation results. The wiring pattern data generated here may be data of a wiring pattern in the correction region as described in the first embodiment, or may be data of a wiring pattern including the correction region and the non-correction region. The wiring pattern data generated by the data generation device 300 is stored in a storage device different from the storage device in which the wiring pattern data used for the control of exposure of the wafer WF on the base substrate B currently being exposed is stored. That is, when the wiring pattern data used for the control of the exposure of the wafer WF on the base substrate B currently being exposed is stored in the first storage device 310R, the data generation device 300 stores (transfers) the generated wiring pattern data in the second storage device 310L.

The wafer WF for which the measurement of the positions of the predetermined measurement points has been completed is carried into the coater/developer device CD together with the base substrate B, is coated with a photosensitive resist, is then carried into the port PT of a substrate exchange unit 2B. Thereafter, the wafer WF is placed on the substrate holder of the substrate stage 30 together with the base substrate B.

The subsequent processing is the same as that of the third embodiment, and thus detailed description thereof will be omitted. In the fourth embodiment, all the operations can be controlled and exposure can be performed using the position of the base substrate B on which the wafers WF are placed and fixed. For example, alignment measurement and correction is performed on the base substrate B even in alignment. That is, since the wafers WF are placed and fixed on the base substrate B, alignment for each wafer WF/each chip is not required when the base substrate B is placed on the substrate holder of the substrate stage 30, and alignment of only the base substrate B is performed. The wafer arrangement device WA attaches the wafers WF to the base substrate B, but the wafers WF may be directly placed and fixed on the tray TR.

(Variation)

In the fourth embodiment, the wafer arrangement device WA and the chip measurement station CMS are separate devices, but this does not intend to suggest any limitation. The measurement microscopes 61 may start measurement of the positions of predetermined measurement points on chips from the wafer WF attached to the base substrate B by the wafer arrangement device WA. In other words, the measurement operation is performed by the measurement microscopes 61 in parallel with the operation of bonding the wafers WF to the base substrate B. The measurement microscopes 61 may start the measurement operation after one wafer WF is bonded to the base substrate B, or may start the measurement operation after a plurality of wafers WF are bonded to the base substrate B. The measurement microscopes 61 may temporarily suspend the measurement operation at the timing when the wafer WF is placed on the base substrate B. This is to prevent vibrations generated when the wafer WF is placed on the base substrate B from affecting the measurement results by the measurement microscopes 61.

(Another Example of Predetermined Measurement Point)

In the first to fourth embodiments, the case where the predetermined measurement points are two of the pads P11*a* of the chip C11 and two of the pads P21 of the chip C21 included in the partial wiring portion WP1 has been described, but this does not intend to suggest any limitation.

Figure 19A:
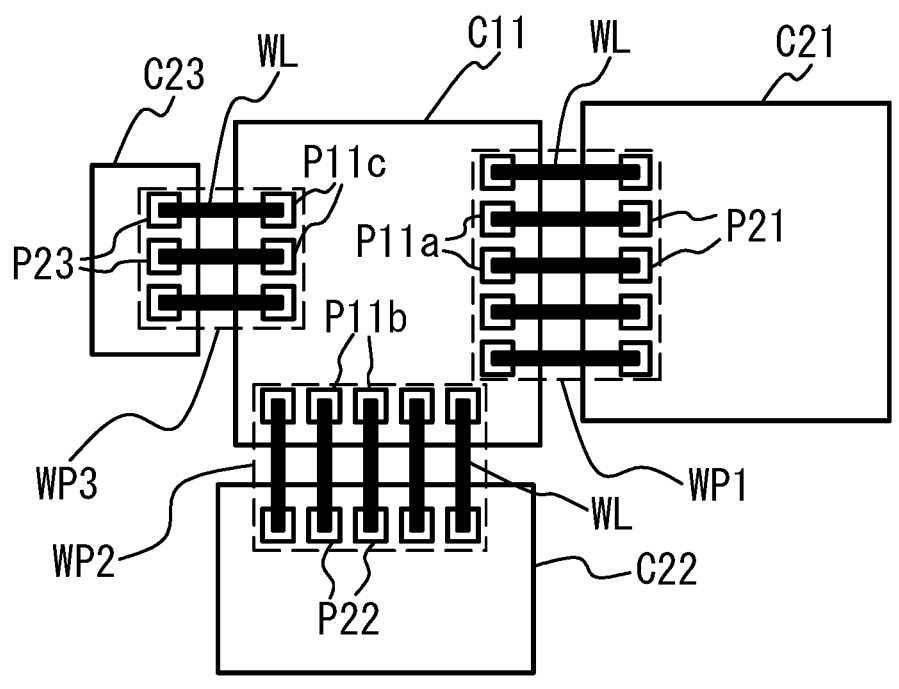
FIG. 19A and FIG. 19B are diagrams for describing another example 1 of predetermined measurement points on a chip.
Figure 19B:
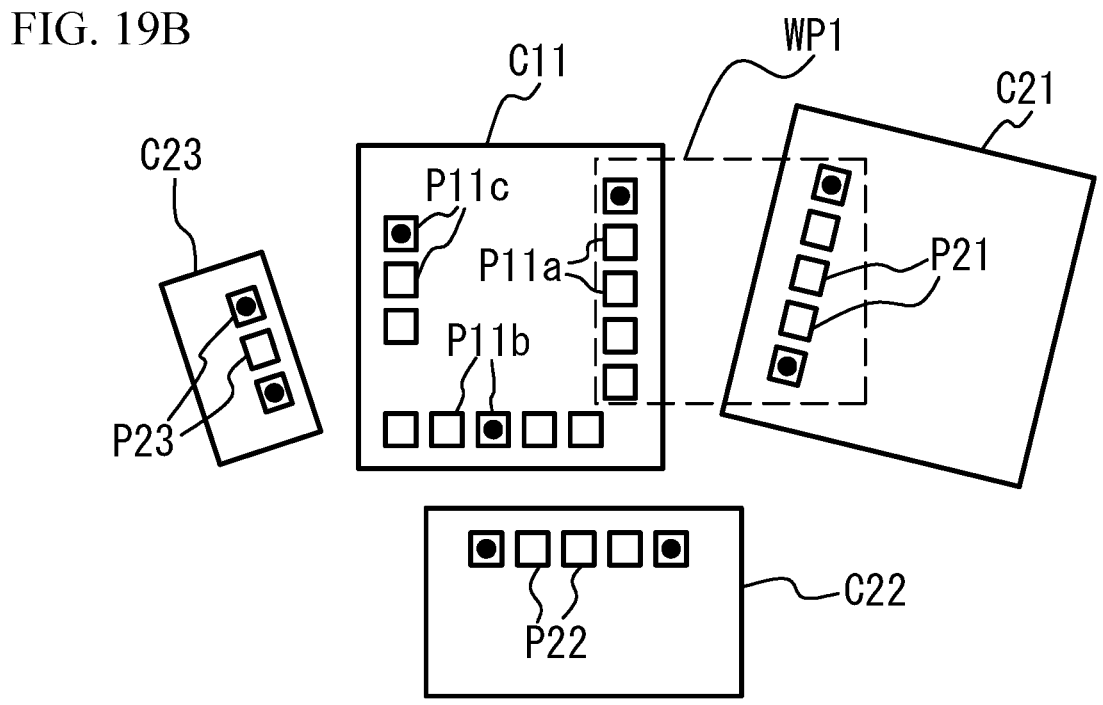

FIG. 19A and FIG. 19B are diagrams for describing another example 1 of the predetermined measurement points on the chip. FIG. 19A illustrates a case where the chips at the design positions are wired to each other, and FIG. 19B illustrates the chip C11 and the chips C21 to C23 fixed on the wafer WF with being shifted from the design positions.

As illustrated in FIG. 19A, the chip C11 is connected to three chips C21 to C23, and each of the chips C21 to C23 is connected to one chip C11.

In another example 1, for the chip C11 connected to the chips C21 to C23, the position and orientation of the chip C11 with respect to the design position are determined by measuring the positions of some of the pads P11*a* to P11*c* on the chip C11, and the positions of all the pads P11*a* to P11*c* are calculated from the position and orientation. To be specific, for the chip C11, at least two pads, preferably three pads, among the pads P11*a* to P11*c* included in the chip C11 are set as the predetermined measurement points. For example, as illustrated in FIG. 19B, pads (indicated by black circles) selected from the pads P11*a*, the pads P11*b*, and the pads P11*c* are set as the predetermined measurement points. This allows the position and orientation of the chip C11 with respect to the design position to be determined, so that the positions of all the pads P11*a* to P11*c* can be calculated based on the design value data of the chip C11. Which of the pads P11*a* to P11*c* are used as the measurement points is determined so that the four parameters: the X-direction shift, the Y-direction shift, the rotation, and the magnification of the chip C11 can be calculated.

On the other hand, for each of the chips C21 to C23 connected to one chip C11, the positions of the pads at both ends in the arrangement direction of the pads P21, the positions of the pads at both ends in the arrangement direction of the pads P22, and the positions of the pads at both ends in the arrangement direction of the pads P23 are measured as the predetermined measurement points in each of the partial wiring portions WP1 to WP3, and the positions of all the pads P21 to P23 are calculated based on the measurement results.

In another example 1, the number of measurement points can be reduced as compared with the case where four pads in each partial wiring portion are measured as described in the first embodiment, and therefore, the time required for measurement can be reduced.

Figure 20A:
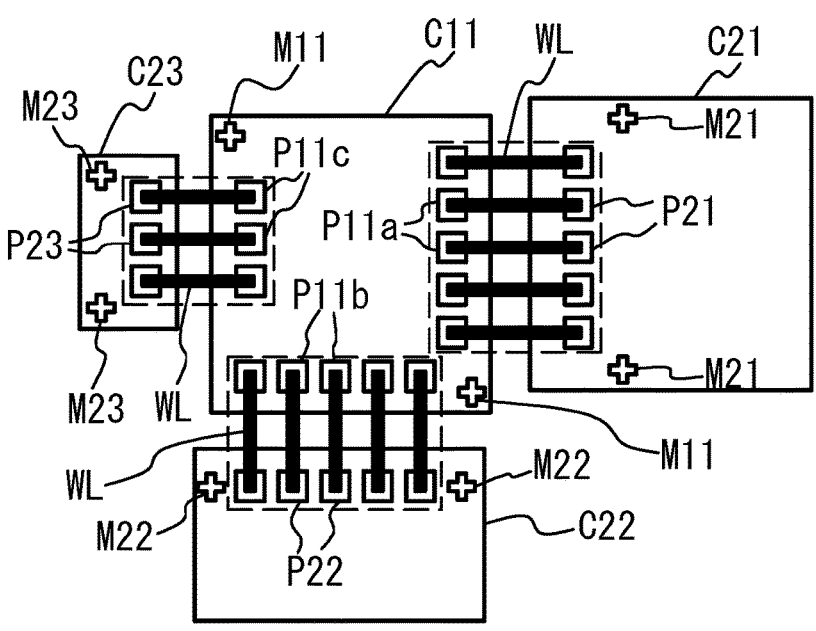
FIG. 20A and FIG. 20B are diagrams for describing another example 2 of predetermined measurement points on a chip.
Figure 20B:
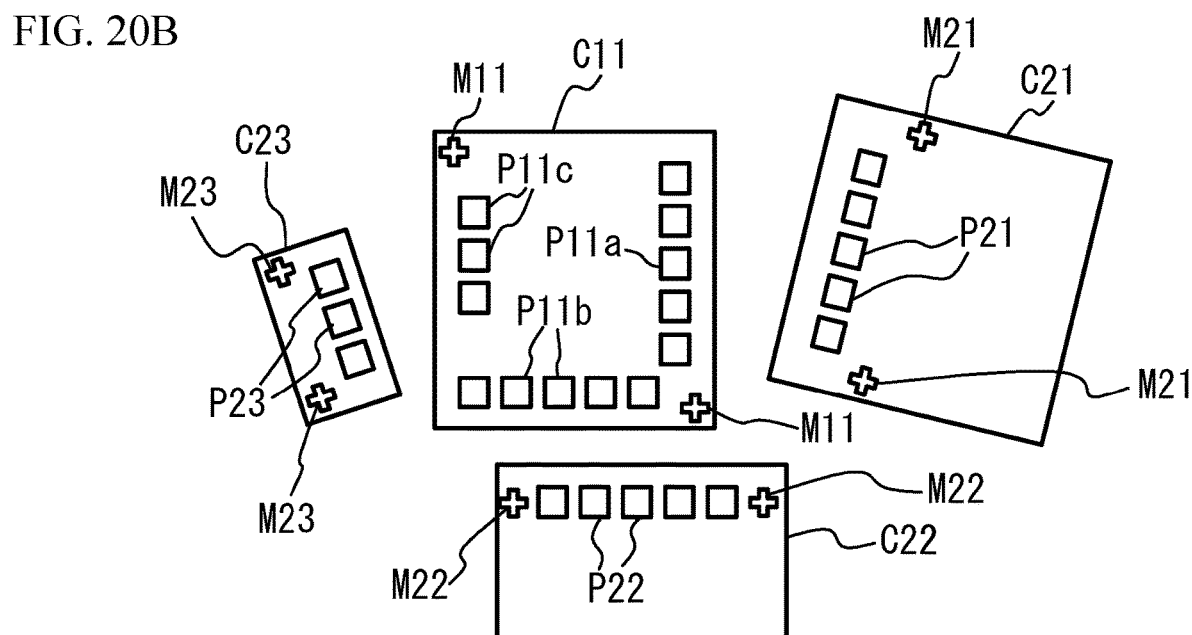

FIG. 20A and FIG. 20B are diagrams for describing another example 2 of the predetermined measurement points on the chips. FIG. 20A illustrates a case where the chips at the design positions are wired to each other, and FIG. 20B illustrates the chip C11 and the chips C21 to C23 fixed on the wafer WF with being shifted from the design positions.

In FIG. 20A and FIG. 20B, predetermined marks M11, M21, M22, and M23 formed on the chips are set as predetermined measurement points. In this case, the coordinates of the pads can be calculated based on the measurement results of the positions of the marks from the design value data of the positional relationship between the marks and the pads. When the position of the pad is measured as the predetermined measurement point, a measurement microscope having a resolution equivalent to the resolution of the exposure apparatus is required. In the case of another example 2, even when the resolution of the measurement microscope is not equivalent to the resolution of the exposure apparatus (even when the resolution of the measurement microscope is lower than the resolution of the exposure apparatus), the coordinates of the pad can be calculated, and therefore, the component cost of the exposure apparatus or the chip measurement station CMS can be reduced.

In the first to fourth embodiments and the variations thereof, the case where a plurality of wafer-shaped substrates are placed on the substrate stage 30 has been described. However, a plurality of rectangular substrates may be placed on the substrate stage 30.

The first to fourth embodiments and the variations thereof are also applicable to the formation of a wiring pattern for connecting chips on the substrate P illustrated in FIG. 3B.

Note that the disclosures of all publications, international publications, U.S. patent application publications, and U.S. patents relating to exposure apparatuses and the like cited in the above description are incorporated herein by reference.

The embodiments described above are examples of preferred embodiments of the present invention. However, the present invention is not limited thereto, and various modifications can be made without departing from the scope of the present invention.

What is claimed is:

1. An exposure apparatus comprising:
a spatial light modulator;
a calculation unit configured to calculate positions of first connection portions of a first semiconductor chip provided on a substrate and positions of second connection portions of a second semiconductor chip provided on the substrate, based on (i) a first position measurement result, (ii) a second position measurement result, and (iii) design information of the first connection portions and the second connection portions, the first connection portions being arranged in a first direction, the second connection portions being arranged in a second direction, the first position measurement result being a measurement result of positions of two first connection portions, which are not adjacent to each other in the first direction, of the first connection portions, the second position measurement result being a measurement result of positions of two second connection portions, which are not adjacent to each other in the second direction, of the second connection portions; and
an exposure processing unit configured to control the spatial light modulator based on a calculation result by the calculation unit so as to expose wiring patterns connecting the first connection portions and the second connection portions.

2. The exposure apparatus according to claim 1, wherein the exposure processing unit changes a position of the spatial light modulator based on the calculation result so as to expose the wiring patterns.

3. An exposure apparatus comprising:
a spatial light modulator;
an optical system into which light from the spatial light modulator enters;
a calculation unit configured to calculate positions of first connection portions of a first semiconductor chip provided on a substrate and positions of second connection portions of a second semiconductor chip provided on the substrate, based on (i) a first position measurement result, (ii) a second position measurement result, and (iii) design information of the first connection portions and the second connection portions, the first connection portions being arranged in a first direction, the second connection portions being arranged in a second direction, the first position measurement result being a measurement result of two first connection portions, which are not adjacent to each other in the first direction, of the first connection portions, the second position measurement result being a measurement result of two second connection portions, which are not adjacent to each other in the second direction, of the second connection portions; and an exposure processing unit configured to control the optical system based on a calculation result by the calculation unit so as to expose wiring patterns connecting the first connection portions and the second connection portions.

4. The exposure apparatus according to claim 3, wherein the exposure processing unit is configured to control the spatial light modulator based on the design information so as to expose the wiring patterns.

5. The exposure apparatus according to claim 4, wherein the spatial light modulator is configured to generate the wiring patterns based on the design information.

6. The exposure apparatus according to claim 1, wherein the two first connection portions are connection portions located at both ends of the first connection portions in the first direction, and wherein the two second connection portions are connection portions located at both ends of the second connection portions in the second direction.

7. The exposure apparatus according to claim 1, further comprising a measurement system configured to measure positions of the two first connection portions on the first semiconductor chip and positions of the two second connection portions on the second semiconductor chip.

8. The exposure apparatus according to claim 1, wherein a part of the wiring pattern is common to a part of a wiring pattern connecting the first connection portions and the second connection portions based on the design information.

9. A method of forming a wiring pattern, the method comprising:

calculating positions of first connection portions of a first semiconductor chip provided on a substrate and positions of second connection portions of a second semiconductor chip provided on the substrate, based on (i) a first position measurement result, (ii) a second position measurement result, and (iii) design information of the first connection portions and the second connection portions, the first connection portions being arranged in a first direction, the second connection portions being arranged in a second direction, the first position measurement result being a measurement result of two first connection portions, which are not adjacent to each other in the first direction, of the first connection portions, the second position measurement result being a measurement result of positions of two second connection portions, which are not adjacent to each other in the second direction, of the second connection portions; and controlling a spatial light modulator based on a calculation result of the calculating so as to expose wiring patterns connecting the first connection portions and the second connection portions.

10. A method of forming a wiring pattern, the method comprising:

calculating positions of first connection portions of a first semiconductor chip provided on a substrate and positions of second connection portions of a second semiconductor chip provided on the substrate, based on (i) a first position measurement result, (ii) a second position measurement result, and (iii) design information of the first connection portions and the second connection portions, the first connection portions being arranged in a first direction, the second connection portions being arranged in a second direction, the first position measurement result being a measurement result of positions of two first connection portions, which are not adjacent to each other in the first direction, of the first connection portions, the second position measurement result being a measurement result of positions of two second connection portions, which are not adjacent to each other in the second direction, of the second connection portions; and controlling an optical system based on a calculation result of the calculating so as to expose wiring patterns connecting the first connection portions and the second connection portions.

11. The method according to claim 10, wherein the optical system is controlled based on the design information so as to expose the wiring patterns.

12. The exposure apparatus according to claim 3, wherein the two first connection portions are connection portions located at both ends of the first connection portions in the first direction, and wherein the two second connection portions are connection portions located at both ends of the second connection portions in the second direction.

13. The exposure apparatus according to claim 2, wherein a part of the wiring pattern is common to a part of a wiring pattern connecting the first connection portions and the second connection portions based on the design information.

14. An exposure apparatus comprising:

a spatial light modulator;

a calculation unit that calculates positions of first connection portions of a first semiconductor chip provided on a substrate and positions of second connection portions of a second semiconductor chip provided on the substrate, based on (i) a first position measurement result, (ii) a second position measurement result, and (iii) design information of the first connection portions and the second connection portions, the first position measurement result being a measurement result of positions of measurement points on the first semiconductor chip, the second position measurement result being a measurement result of positions of measurement points on the second semiconductor chip; and an exposure processing unit that exposes wiring patterns connecting the first connection portions and the second connection portions, respectively, by controlling the spatial light modulator based on a calculation result by the calculation unit, wherein each of the wiring patterns includes (i) a first wiring patten having a first end connected to a corresponding first connection portion, (ii) a second wiring pattern having a first end connected to a corresponding second connection portion, and (iii) a third wiring pattern that connects a second end of the first wring pattern and a second end of the second wiring pattern and does not overlap the first semiconductor chip nor the second semiconductor chip, wherein the first wiring pattern is a pattern obtained by correcting a first part connected to the corresponding first connection portion of a designed wiring pattern, which connects the corresponding first connection portion and the corresponding second connection portion, based on the calculation result by the calculation unit, wherein the second wiring pattern is a pattern obtained by correcting a second part connected to the corresponding second connection portion of the designed wiring pattern, based on the calculation result by the calculation unit, and wherein the third wiring pattern is common to a part other than the first part and the second part of the designed wiring pattern.

15. The exposure apparatus according to claim 14, wherein the exposure processing unit changes a position of the spatial light modulator based on the calculation result by the calculation unit to expose the wiring patterns connecting the first connection portions and the second connection portions.

16. The exposure apparatus according to claim 14, wherein the measurement points on the first semiconductor chip are at least two of the first connection portions or marks formed on the first semiconductor chip, and wherein the measurement points on the second semiconductor chip are at least two of the second connection portions or marks formed on the second semiconductor chip.

17. The exposure apparatus according to claim 14, wherein the measurement points on the first semiconductor chip are two first connection portions, which are not adjacent to each other in an arrangement direction of the first connection portions, of the first connection portions, and wherein the measurement points on the second semiconductor chip are two second connection portions, which are not adjacent to each other in an arrangement direction of the second connection portions, of the second connection portions.

18. The exposure apparatus according to claim 14, wherein the measurement points on the first semiconductor chip include at least one of the first connection portions and at least one of connection portions, which are connected to connection portions of a third semiconductor chip, of the first connection portions.

19. The exposure device according to claim 14, further comprising a measurement system that measures the positions of the measurement points on the first semiconductor chip and the positions of the measurement points on the second semiconductor chip.

20. A method of forming a wiring pattern, the method comprising:

calculating positions of first connection portions of a first semiconductor chip provided on a substrate and positions of second connection portions of a second semiconductor chip provided on the substrate, based on (i) a first position measurement result, (ii) a second position measurement result, and (iii) design information of the first connection portions and the second connection portions, the first position measurement result being a measurement result of positions of measurement points on the first semiconductor chip, the second position measurement result being a measurement result of positions of measurement points on the second semiconductor chip; and exposing wiring patterns connecting the first connection portions and the second connection portions, respectively, by controlling a spatial light modulator based on a calculation result of the calculating, wherein each of the wiring patterns includes a first wiring patten having a first end connected to a corresponding first connection portion, a second wiring pattern having a first end connected to a corresponding second connection portion, and a third wiring pattern that connects a second end of the first wring pattern and a second end of the second wiring pattern and does not overlap the first semiconductor chip nor the second semiconductor chip, wherein the first wiring pattern is a pattern obtained by correcting a first part connected to the corresponding first connection portion of a designed wiring pattern, which connects the corresponding first connection portion and the corresponding second connection portion, based on the calculation result, wherein the second wiring pattern is a pattern obtained by correcting a second part connected to the corresponding second connection portion of the designed wiring pattern, based on the calculation result, and wherein the third wiring pattern is common to a part other than the first part and the second part of the designed wiring pattern.

\* \* \* \* \*